(12) United States Patent
Shirakawa

(10) Patent No.: US 10,803,959 B2
(45) Date of Patent: *Oct. 13, 2020

(54) MEMORY SYSTEM INCLUDING THE SEMICONDUCTOR MEMORY AND A CONTROLLER

(71) Applicant: Toshiba Memory Corporation, Minato-ku (JP)

(72) Inventor: Masanobu Shirakawa, Chigasaki (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/563,045

(22) Filed: Sep. 6, 2019

(65) Prior Publication Data

US 2019/0392906 A1 Dec. 26, 2019

Related U.S. Application Data

(63) Continuation of application No. 15/916,472, filed on Mar. 9, 2018.

(30) Foreign Application Priority Data

Sep. 21, 2017 (JP) .................................. 2017-181682

(51) Int. Cl.
*G11C 16/06* (2006.01)
*G11C 16/26* (2006.01)
(Continued)

(52) U.S. Cl.
CPC ............. *G11C 16/26* (2013.01); *G11C 7/06* (2013.01); *G11C 11/5628* (2013.01); *G11C 11/5642* (2013.01); *G11C 11/5671* (2013.01);
*G11C 16/10* (2013.01); *G11C 16/3459* (2013.01); *H01L 27/1157* (2013.01); *H01L 27/11582* (2013.01); *G11C 7/1039* (2013.01); *G11C 16/0483* (2013.01); *G11C 2211/562* (2013.01);
(Continued)

(58) Field of Classification Search
CPC ........................................................ G11C 8/12
USPC .................................................... 365/185.11
See application file for complete search history.

(56) References Cited

U.S. PATENT DOCUMENTS 8,144,512 B2 3/2012 Huang et al.
8,250,437 B2 8/2012 Sakurada et al.
(Continued)

FOREIGN PATENT DOCUMENTS

JP 2008-535138 8/2008
JP 2016-62624 4/2016

*Primary Examiner* — Hoai V Ho
(74) *Attorney, Agent, or Firm* — Oblon, McClelland, Maier & Neustadt, L.L.P.

(57) ABSTRACT

According to one embodiment, a memory system includes a semiconductor memory and a controller. The semiconductor memory includes first blocks including a memory cell capable of storing data of one bit, a second block including a memory cell capable of storing data of two or more bits. The semiconductor memory stores first data in a first latch circuit, and second data in a second latch circuit, and writes the first data into one of the first blocks in page units, and the second data into one of the first blocks in page units. The semiconductor memory writes data of at least two pages into the second block, using the first data stored in the first latch circuit and the second data stored in the second latch circuit.

19 Claims, 28 Drawing Sheets

(51) Int. Cl.
    *G11C 11/56* (2006.01)
    *H01L 27/1157* (2017.01)
    *G11C 7/06* (2006.01)
    *G11C 16/34* (2006.01)
    *H01L 27/11582* (2017.01)
    *G11C 16/10* (2006.01)
    G11C 7/10 (2006.01)
    G11C 16/04 (2006.01)

(52) U.S. Cl.
    CPC . *G11C 2211/563* (2013.01); *G11C 2211/5621* (2013.01); *G11C 2211/5641* (2013.01); *G11C 2211/5642* (2013.01)

(56) References Cited

U.S. PATENT DOCUMENTS

| | | |
|---|---|---|
| 10,453,536 B2 * | 10/2019 | Shirakawa ........ H01L 27/11582 |
| 2006/0221697 A1 | 10/2006 | Li et al. |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2016/0078949 A1 | 3/2016 | Abe et al. |
| 2018/0189135 A1 | 7/2018 | Naik |

* cited by examiner

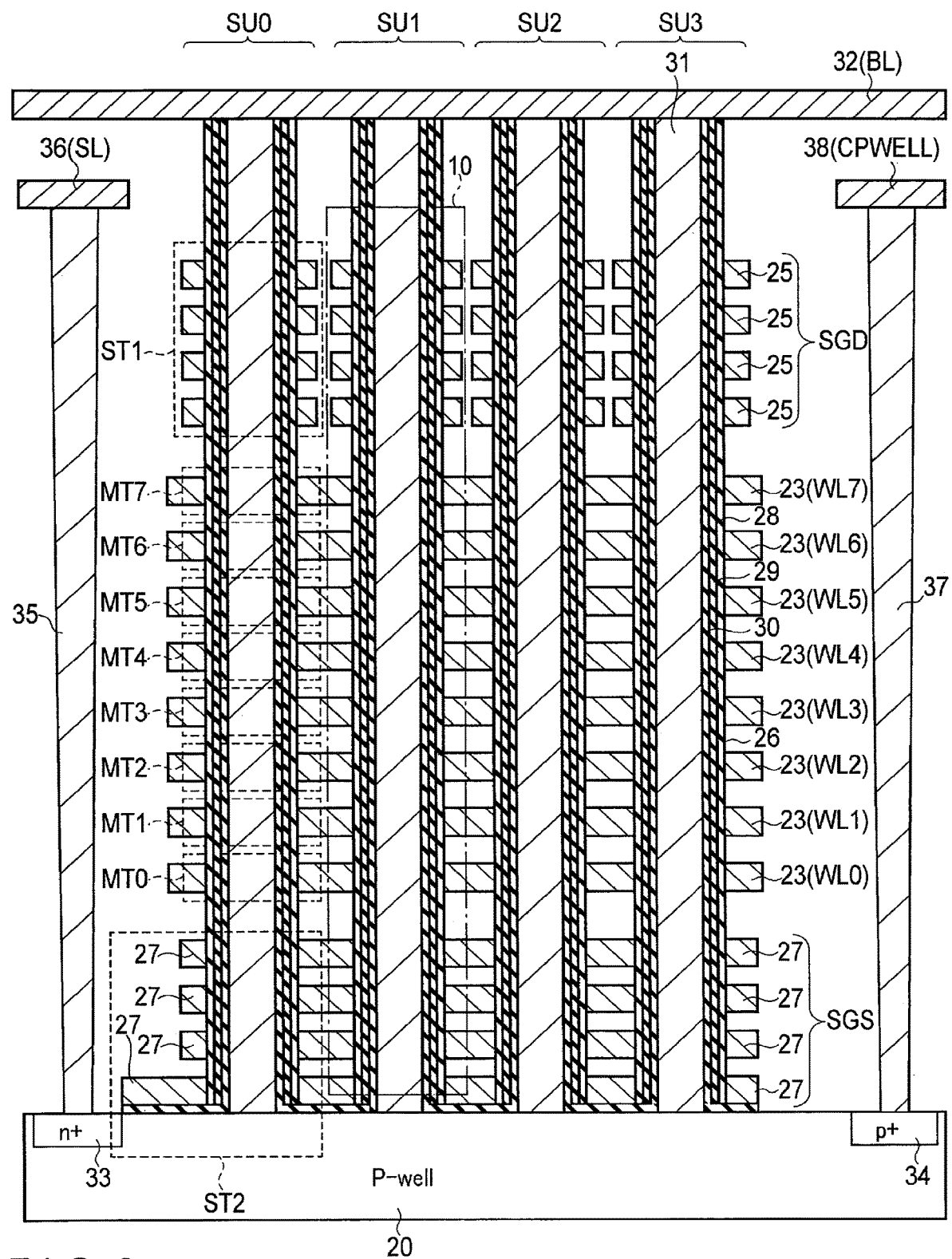
F I G. 3

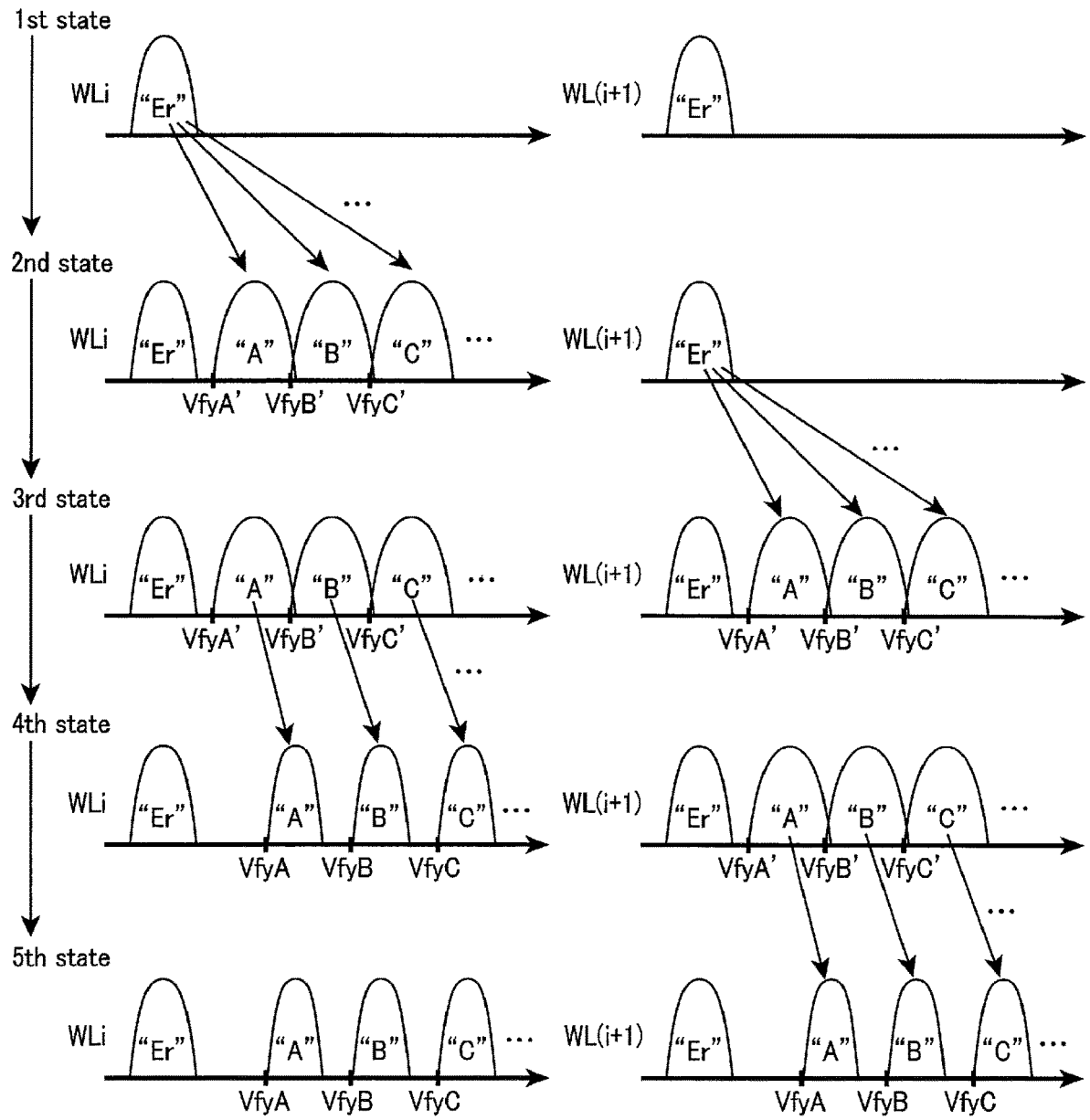
F I G. 6

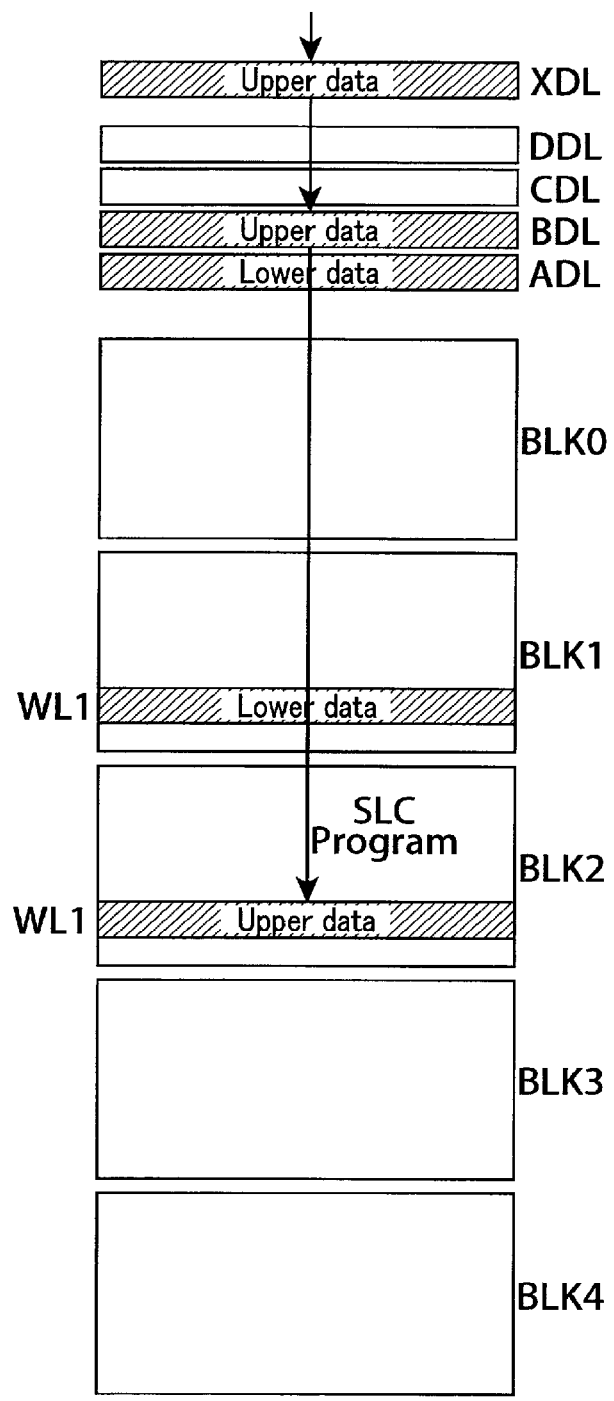
F I G. 10

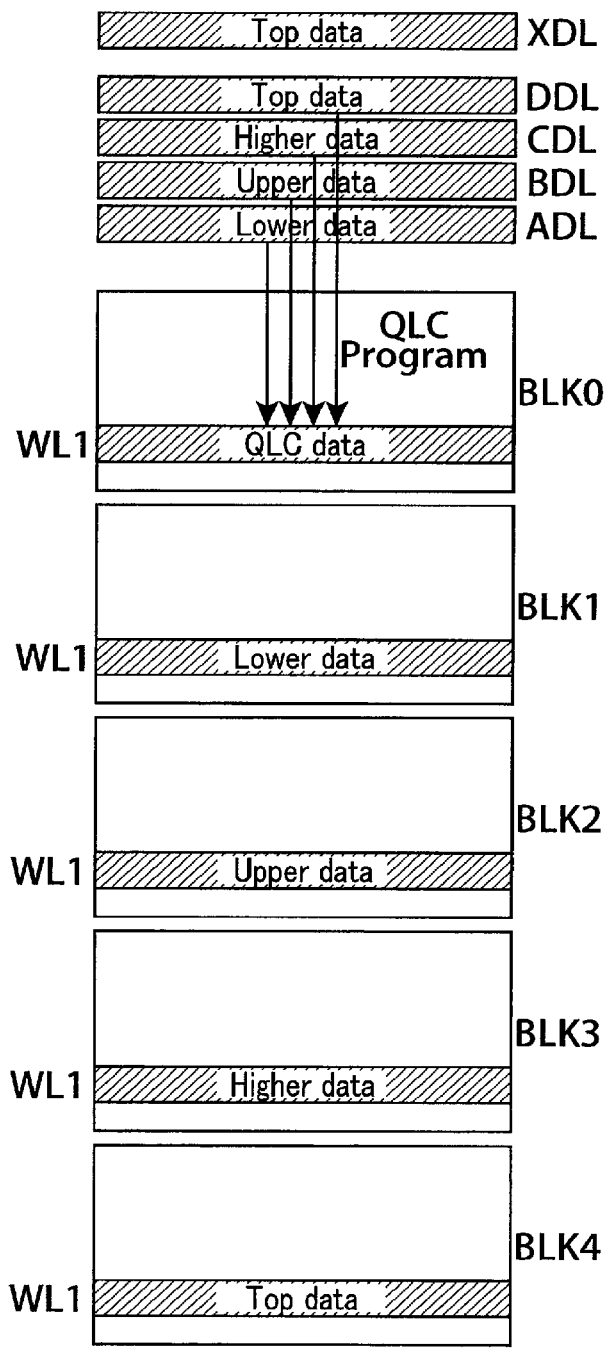
F I G. 13

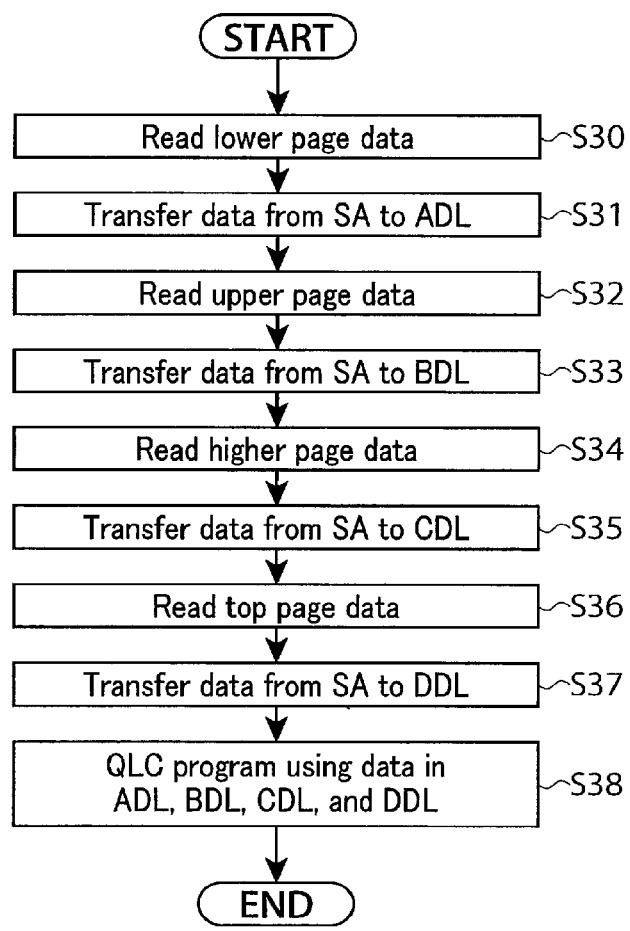
F I G. 15

| IO7 | IO6 | IO5 | IO4 | IO3 | IO2 | IO1 | IO0 |
|---|---|---|---|---|---|---|---|
| Write Protect<br>0: write protect<br>1: no write protect | Cache Busy<br>0: cache busy<br>1: cache ready | True Busy<br>0: true busy<br>1: true ready | SLC<br>(N-4)<br>0: Pass, 1: Fail | SLC<br>(N-3)<br>0: Pass, 1: Fail | SLC<br>(N-2)<br>0: Pass, 1: Fail | SLC<br>(N-1)<br>0: Pass, 1: Fail | MLC<br>(N: current operation)<br>0: Pass, 1: Fail |

- E0 (1110 0000): Pass
- E1 (1110 0001): QLC program failed
  →Changing address, and repeating QLC program
- E2 (1110 0010): SLC program failed and QLC program passed
  →Changing address, and repeating SLC program (top page)
- E3 (1110 0011): SLC program failed and QLC program failed
  →Changing address, and repeating SLC program (top page) and QLC program

F I G. 23

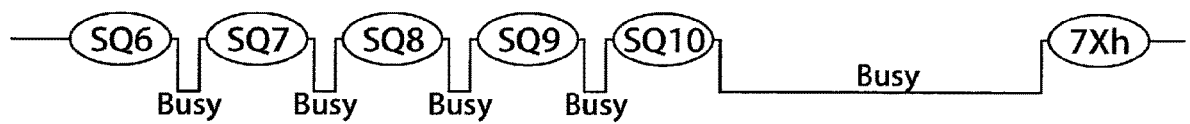
F I G. 24

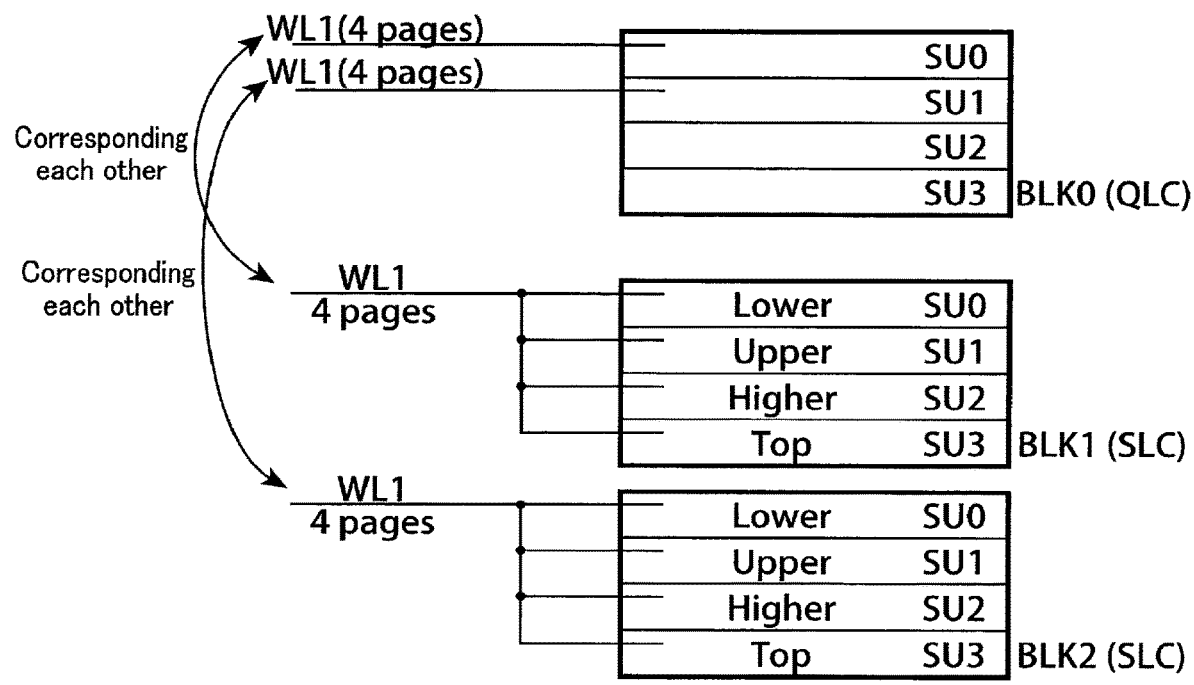
F I G. 25

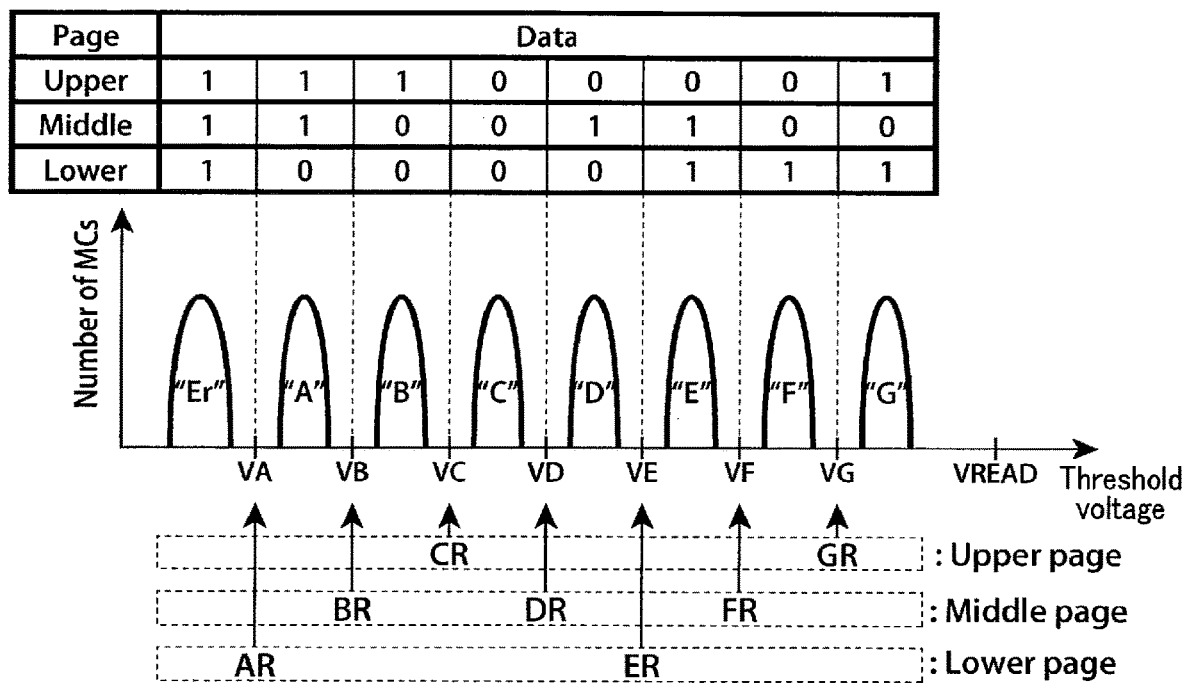
F I G. 26

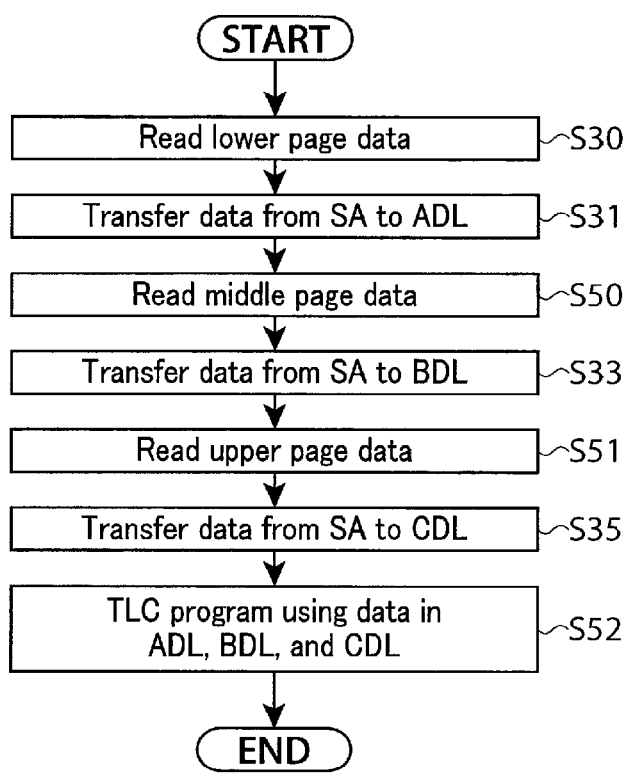
F I G. 28

MEMORY SYSTEM INCLUDING THE SEMICONDUCTOR MEMORY AND A CONTROLLER

CROSS-REFERENCE TO RELATED APPLICATIONS

This application is a continuation of U.S. application Ser. No. 15/916,472 filed Mar. 9, 2018, which is based upon and claims the benefit of priority from Japanese Patent Application No. 2017-181682, filed Sep. 21, 2017, the entire contents of each of which are incorporated herein by reference.

FIELD

Embodiments described herein relate generally to a memory system.

BACKGROUND

A semiconductor memory in which memory cells are three-dimensionally arranged is known.

BRIEF DESCRIPTION OF THE DRAWINGS

FIGS. 2 and 3 are a circuit diagram and a cross section of a block of memory cells according to the first embodiment.

FIG. 6 includes charts showing changes of the threshold distributions in a write operation according to the first embodiment.

FIGS. 9, 10, 11, and 12 schematically illustrate the memory cell array and the column control circuit in the write operation according to the first embodiment.

FIG. 13 schematically illustrates the memory cell array and the column control circuit in the write operation according to the first embodiment.

FIG. 15 is a flowchart of the write operation according to the first embodiment.

FIG. 23 shows information obtainable in response to a status read command according to the second embodiment.

FIG. 24 shows command sequences in the write operation according to the second embodiment.

FIG. 25 is a block diagram of the memory cell array according to a modification example of the first and second embodiments.

FIG. 26 includes a chart showing the threshold distributions of memory cells and a diagram schematically showing the relationship between pages and read operations according to the modification example of the first and second embodiments.

FIGS. 27 and 28 are flowcharts of write operations according to the modification examples of the first and second embodiments.

DETAILED DESCRIPTION

In general, a memory system according to one embodiment includes: a semiconductor memory capable of storing data; and a controller configured to control the semiconductor memory. The semiconductor memory includes: a plurality of first blocks each including a memory cell capable of storing data of one bit; a second block including a memory cell capable of storing data of two or more bits; and a sense amplifier including a first latch circuit and a second latch circuit. In a write operation, the controller outputs a set of first data of one page and a first write command, a set of second data of one page and a second write command, and a third write command. The semiconductor memory stores the first data in the first latch circuit, and the second data in the second latch circuit. The semiconductor memory writes the first data into one of the first blocks in page units, and the second data into a second one of the first blocks in page units. When receiving the third write command, the semiconductor memory writes data of at least two pages into the second block, using the first data stored in the first latch circuit and the second data stored in the second latch circuit.

1. First Embodiment

A memory system according to a first embodiment is now explained. In the explanation below, byway of example, a memory system comprising a NAND flash memory for a semiconductor memory device is discussed.

1.1 Configuration 1.1.1 Overall Configuration of Memory System

First, the outline of the overall configuration of a memory system according to the present embodiment will be discussed with reference to FIG. 1.

Figure 1:
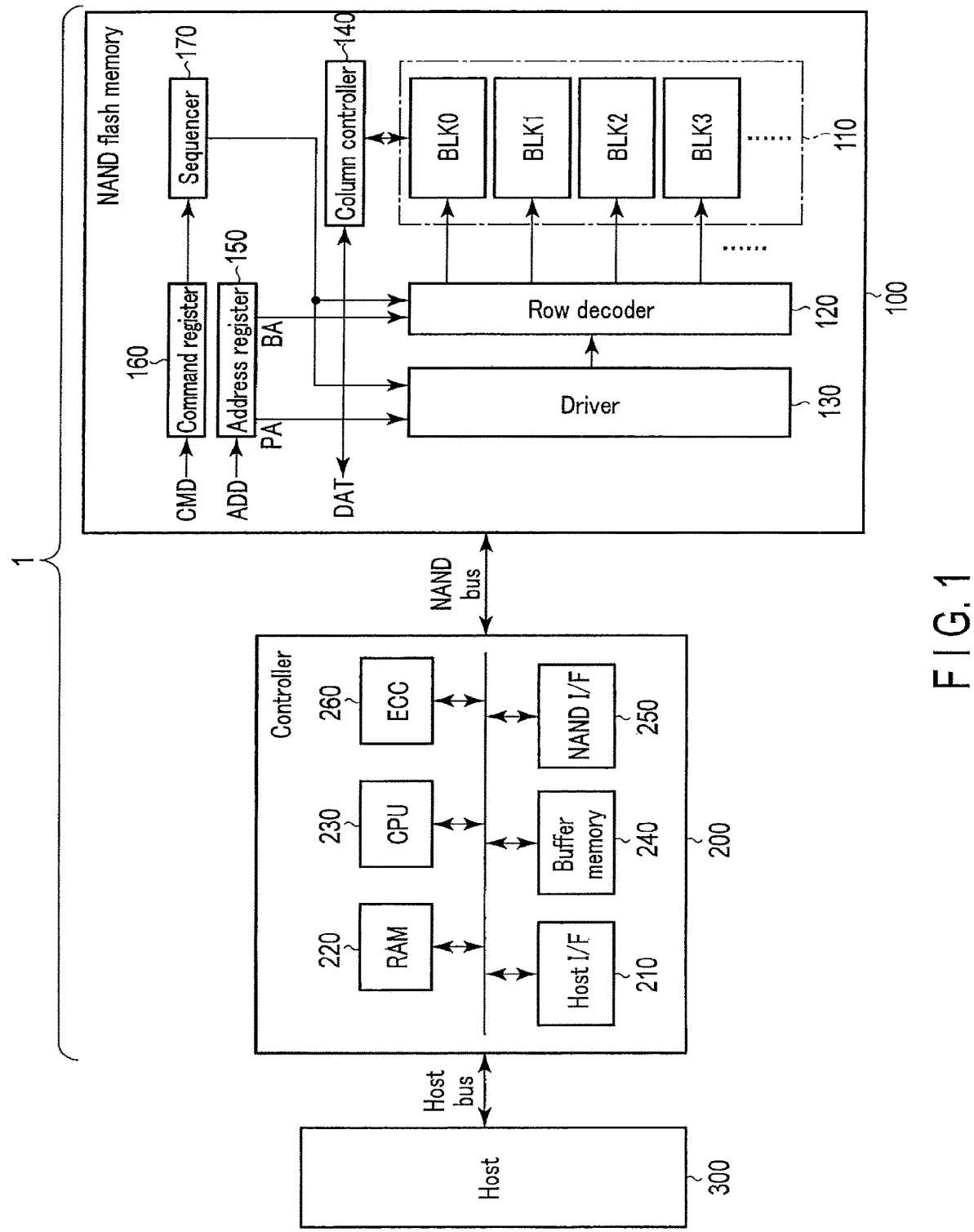
FIG. 1 is a block diagram showing a memory system according to a first embodiment.

As shown in FIG. 1, the memory system 1 includes a NAND flash memory 100 and a controller 200. The NAND flash memory 100 and the controller 200 may be integrated into a semiconductor device, an example of which may be a memory card such as an SD™ card, and a solid state drive (SSD). The controller 200 may be a system on chip (SoC) or the like.

The NAND flash memory 100 comprises a plurality of memory cells to store data in a non-volatile manner. The controller 200 is connected to the NAND flash memory 100 via a NAND bus, and is also connected to a host device 300 via a host bus. The controller 200 controls the NAND flash memory 100, and makes an access to the NAND flash memory 100 in response to a command received from the host device 300. The host device 300 may be a digital camera or a personal computer. The host bus is designed to comply with, for example, the SD™ interface specification.

The NAND bus is used for transmission and reception of signals in compliance with the NAND interface specification.

1.1.2 Configuration of Controller 200

The configuration of the controller 200 will be explained in detail, by referring to FIG. 1. As illustrated in FIG. 1, the controller 200 includes a host interface circuit 210, an internal memory (RAM) 220, a processor (CPU) 230, a buffer memory 240, a NAND interface circuit 250, and an error checking and correcting (ECC) circuit 260.

The host interface circuit 210 is connected to the host device 300 via the host bus, and transfers the commands and data received from the host device 300 to the processor 230 and to the buffer memory 240, respectively. The host interface circuit 210 also transfers the data stored in the buffer memory 240 to the host device 300, in response to an instruction by the processor 230.

The processor 230 controls the entire operation of the controller 200. For example, in response to a write command received from the host device 300, the processor 230 issues a write instruction to the NAND interface circuit 250. The processor 230 performs in a similar manner in read and erase. The processor 230 executes various operations, including wear leveling, to manage the NAND flash memory 100. The operations of the controller 200 discussed below may be implemented by one or more processors executing software (firmware), or may be implemented by hardware.

The NAND interface circuit 250 is connected to the NAND flash memory 100 via the NAND bus to conduct communications with the NAND flash memory 100. In response to the instructions received from the processor 230, the NAND interface circuit 250 transmits various signals to the NAND flash memory 100, and receives various signals from the NAND flash memory 100.

The buffer memory 240 temporarily stores write data and read data.

The internal memory 220 may be a semiconductor memory such as a DRAM and an SRAM, which serves as a work area for the processor 230. The internal memory 220 stores firmware, various management tables and the like that are used for the management of the NAND flash memory 100.

The ECC circuit 260 performs error detection and error correction processing for the data stored in the NAND flash memory 100. That is, the ECC circuit 260 generates an error correction code and appends this code to the write data when writing data, and decodes an error correction code when reading the data.

1.1.3 Configuration of NAND Flash Memory 100
1.1.3.1 Overall Configuration of NAND Flash Memory 100

Next, the configuration of the NAND flash memory 100 will be explained. As illustrated in FIG. 1, the NAND flash memory 100 includes a memory cell array 110, a row decoder 120, a driver circuit 130, a column controller 140, an address register 150, a command register 160, and a sequencer 170.

The memory cell array 110 has a plurality of blocks BLKs each of which includes a plurality of non-volatile memory cells associated with rows and columns. The memory cell array 110 stores the data provided by the controller 200.

The row decoder 120 selects one of the blocks BLKs, and further selects memory cells in a direction of rows in the selected block BLK.

The driver circuit 130 supplies voltages to the selected block BLK via the row decoder 120.

When reading data DAT, the column controller 140 senses data read out of the memory cell array 110, and conducts necessary computing operations on the data. The data DAT is output to the controller 200. When writing data DAT, the write data DAT received from the controller 200 is transferred to the memory cell array 110.

The address register 150 stores an address ADD received from the controller 200. The command register 160 stores a command CMD received from the controller 200.

The sequencer 170 controls the entire operation of the NAND flash memory 100, based on the various kinds of information held in the registers 150 and 160.

1.1.3.2 Configuration of Block BLK

Figure 2:
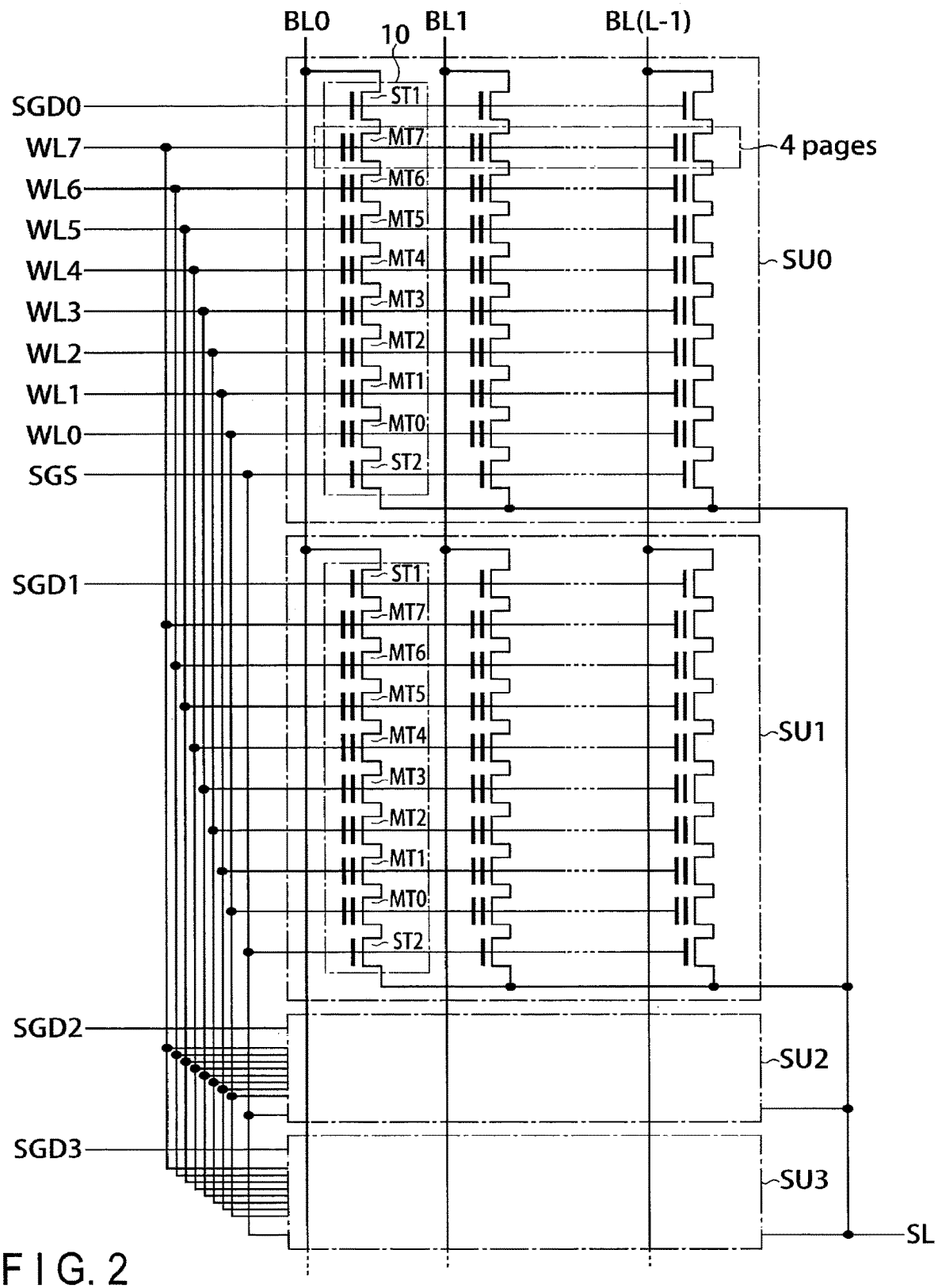

Next, the configuration of the above-described block BLK will be explained with reference to FIG. 2. As illustrated in FIG. 2, the block BLK may include four string units SUs (SU0 to SU3), and each of the string units SUs includes a plurality of NAND strings 10.

Each of the NAND strings 10 may include eight memory cell transistors MTs (MT0 to MT7) and selection transistors ST1 and ST2. Each of the memory cell transistors MTs includes a control gate and a charge storage layer, and stores data in a non-volatile manner. The memory cell transistors MTs are connected in series between the source of the selection transistor ST1 and the drain of the selection transistor ST2.

In each of the string units SU0 to SU3, the gates of the selection transistors ST1 are connected to the corresponding one of select gate lines SGD0 to SGD3. On the other hand, the gates of the selection transistors ST2 in each of the string units SU0 to SU3 may be connected in common to a select gate line SGS. Alternatively, the gates of the selection transistors ST2 may be connected to different one of select gate lines SGS0 to SGS3 for different string units SU0 to SU3. The control gates of the memory cell transistors MT0 to MT7 in the same block BLK are connected in common to different one of the word lines WL0 to WL7 for different rows.

In the memory cell array 110, the drains of the selection transistors ST1 in the NAND strings 10 that are arranged in the same column are connected in common to a bit line BL (one of BL0 to BL(L-1), where (L-1) is any positive integer greater than or equal to 2). That is, the bit lines BL connect the NAND strings 10 among the multiple blocks BLKs in common. Furthermore, the sources of the multiple selection transistors ST2 are connected to the source line SL in common.

In other words, one string unit SU includes a plurality of NAND strings 10 that are connected to different bit lines BL and to the same select gate line SGD. One block BLK includes a plurality of string units SUs that share a plurality of word lines WL. Furthermore, a memory cell array 110 includes a plurality of blocks BLKs that share a plurality of bit lines BL.

FIG. 3 is a cross section of a region of a block BLK. As illustrated in FIG. 3, a plurality of NAND strings 10 is formed on a p-well region 20. In particular, four interconnects 27 which serve as a select gate line SGS, eight interconnects 23 which serve as word lines WL0 to WL7, and four interconnects 25 which serve as a select gate line SGD may be stacked in turn over the well region 20. Insulating films (not shown) are formed between the stacked interconnects.

Conductors 31 are formed into a pillar to extend through the interconnects 25, 23, and 27 and reaching the P-well region 20. A gate insulation film 30, a charge storage layer (an insulation film) 29, and a block insulation film 28 are arranged in turn on the side surfaces of the conductors 31 to form the memory cell transistors MTs and selection transistors ST1 and ST2. A current path for the NAND strings 10 and a region in which a channel of each transistor is formed are provided in the conductors 31. At the upper end of the conductor 31, a metal interconnect 32 that serves as a bit line BL is arranged.

An $n^+$ impurity diffusion layer 33 is formed in the surface region of the P-well region 20. A contact plug 35 is formed on the diffusion layer 33, and is connected to a metal interconnect 36 that serves as a source line SL. A $p^+$ impurity diffusion layer 34 is also formed in the surface region of the P-well region 20. A contact plug 37 is formed on the diffusion layer 34, and is connected to a metal interconnect 38 that serves as a well interconnect CPWELL. The well interconnect CPWELL is to apply a voltage to the conductors 31 via the P-well region 20.

A plurality of configurations that are the same as the above-described one are arranged in the depth direction of the sheet of FIG. 3. A plurality of NAND strings 10 aligned in the depth direction form one string unit SU.

In the example of this embodiment, one memory cell transistor MT is capable of holding 4-bit data. This data contains four bits, which will be referred to as a lower bit, an upper bit, a higher bit, and a top bit from the least significant bit to the most significant bit. A group of lower bits held by the memory cells that are connected to the same word line WL in the same string unit SU are referred to as a lower page, and in a similar manner, groups of upper bits, higher bits, and top bits are referred to as an upper page, a higher page, and a top page, respectively. That is, four pages are assigned to one word line WL in each string unit SU. In this example, since each string unit SU contains eight word lines WL, each string unit SU is provided with a capacity of 32 pages. Since one block BLK contains four string units SUs, one block BLK is provided with a capacity of 128 pages. A "page" may also be defined as part of the memory space created by the memory cells that are connected to the same word line. Data is written and read out on page-by-page basis.

In the operation of writing data, one of the blocks BLKs is used as a cache block, the details of which will be described later. It should be noted that, when a block BLK is used as the cache block, one memory cell transistor MT holds data of 1 bit instead of 4 bits. That is, one page is assigned to one word line WL in each string unit SU. This means that a string unit SU has a capacity of eight pages, and a block BLK has a capacity of 32 pages.

Data erasing may be performed a block-by-block basis, or in any units smaller than one block BLK. An erase method is disclosed, for example, in U.S. patent application Ser. No. 13/235,389 filed on Sep. 18, 2011, titled "Nonvolatile Semiconductor Memory Device." It is also disclosed in U.S. patent application Ser. No. 12/694,690 filed on Jan. 27, 2010, titled "Non-Volatile Semiconductor Storage Device." It is further disclosed in U.S. patent application Ser. No. 13/483,610 filed on May 30, 2012, titled "Nonvolatile Semiconductor Memory Device and Data Erase Method thereof." The entire contents of these patent applications are incorporated herein by reference.

The memory cell array 110 may have a configuration different from the above-described one. For example, a configuration of the memory cell array 110 is discussed in U.S. patent application Ser. No. 12/407,403 filed on Mar. 19, 2009, titled "Three Dimensional Stacked Nonvolatile Semiconductor Memory". Another configuration is also discussed in U.S. patent application Ser. No. 12/406,524 filed on Mar. 18, 2009, titled "Three Dimensional Stacked Nonvolatile Semiconductor Memory"; U.S. patent application Ser. No. 12/679,991, filed on Mar. 25, 2010, titled "Non-Volatile Semiconductor Storage Device and Method of Manufacturing the Same"; and U.S. patent application Ser. No. 12/532, 030 filed on Mar. 23, 2009, titled "Semiconductor Memory and Method for Manufacturing Same." The entire contents of these patent applications are incorporated by reference herein.

1.1.3.3 Configuration of Column Controller 140

Figure 4:
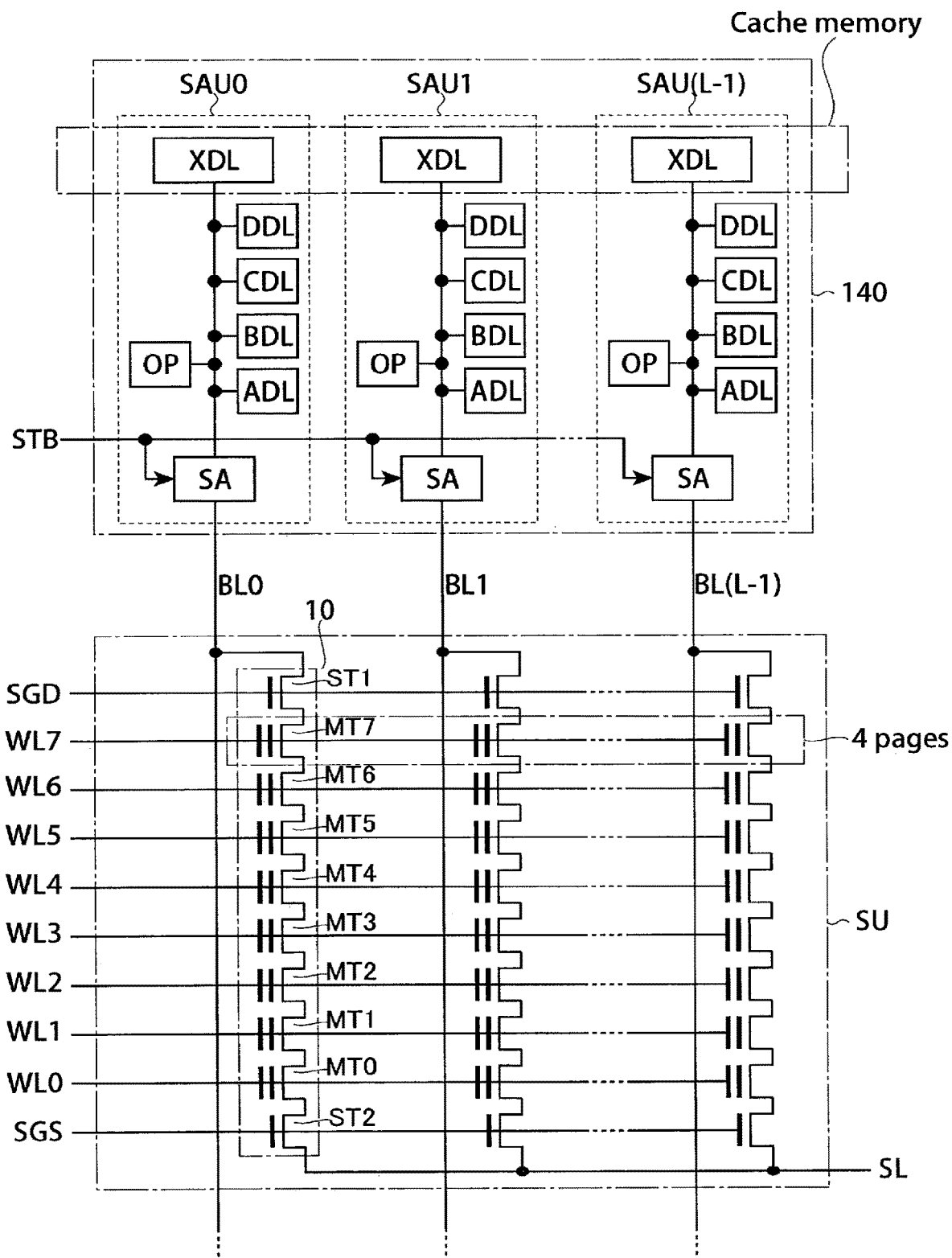
FIG. 4 is a circuit diagram illustrating a memory cell array and a column control circuit according to the first embodiment.

Next, the configuration of the column controller 140 will be explained with reference to FIG. 4. FIG. 4 is a circuit diagram of the column controller 140 and the string unit SU0 according to the present embodiment.

As illustrated in FIG. 4, the column controller 140 includes sense units SAUs (SAU0 to SAU (L-1)) that are provided for respective bit lines BL.

Each of the sense units SAUs includes a sense amplifier SA, a computing section OP, and latch circuits ADL, BDL, CDL, DDL, and XDL.

The sense amplifier SA senses the data that is read onto a corresponding bit line BL, and applies a voltage to the bit line BL in accordance with data to be written. That is, the sense amplifier SA is a module that directly controls the bit lines BL. In the read operation, a strobe signal STB is provided to the sense amplifier SA by the sequencer 170. The sense amplifier SA determines the data to be read out upon assertion of the signal STB (in this example, the data is defined as "0" when the memory cell is turned on, while the data is "1" when the memory cell is turned off). The sense amplifier holds this data in its latch circuit that is internally provided (not shown in FIG. 4), and also transfers the data to one of the latch circuits ADL, BDL, CDL, DDL, and XDL.

The latch circuits ADL, BDL, CDL, DDL, and XDL temporarily hold data read and data to be written. The computing section OP executes, onto data held in the sense amplifier SA and the latch circuits ADL, BDL, CDL, DDL, and XDL, various logical computing operations including NOT, OR, AND, XOR, and XNOR operations.

The sense amplifier SA, the latch circuits ADL, BDL, CDL, DDL, and XDL, and the computing section OP are connected to each other via the bus so that the data can be transmitted to and received from each other. This bus is further connected to the latch circuit XDL.

The data is input to and output from the column controller 140 via the latch circuit XDL. That is, data received from the controller 200 is transferred to any of the latch circuits ADL, BDL, CDL, and DDL, or to the sense amplifier SA via the latch circuit XDL. Data of any of the latch circuits ADL, BDL, CDL, and DDL, or of the sense amplifier SA is transmitted to the controller 200 via the latch circuit XDL. This latch circuit XDL functions as a cache memory of the NAND flash memory 100. For this reason, even if the latch circuits ADL, BDL, CDL, and DDL are in use, the NAND flash memory 100 can be in a ready state as long as the latch circuit XDL is available.

1.1.3.4 Data Held in Memory Cell Transistors and Threshold Voltages

Figure 5:
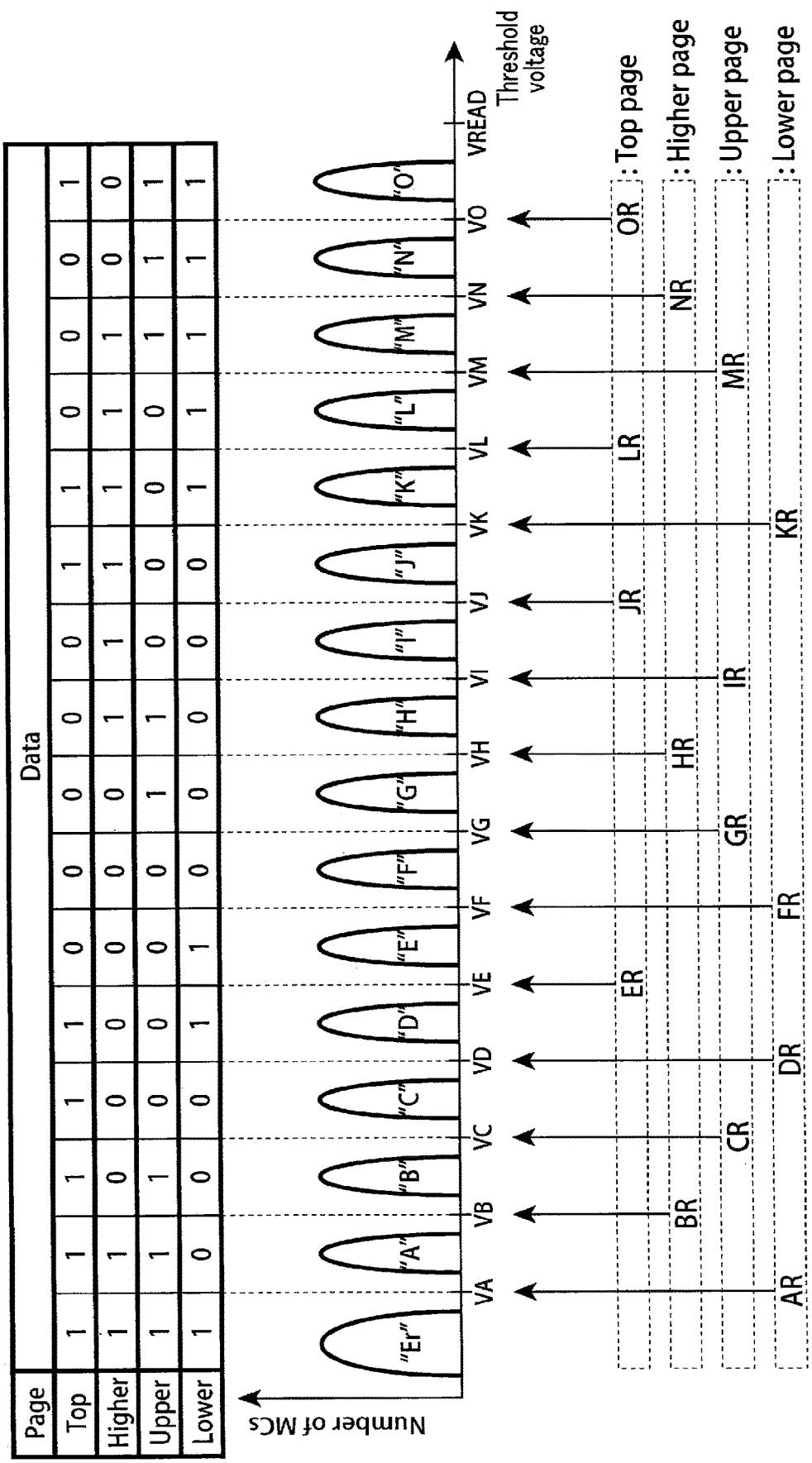
FIG. 5 includes a chart showing threshold distributions of memory cells and a diagram schematically showing the relationship between pages and read operations according to the first embodiment.

The data held in the memory cell transistors MTs, threshold voltages, and readout levels of data will be explained with reference to FIG. 5. FIG. 5 is a diagram which shows data that can be held in each memory cell transistor MT, threshold distributions, and voltages used for the read operation.

As described above, a memory cell transistor MT is configured to hold data of 4 bits in accordance with the threshold voltages. The data expressed by these four bits will be referred to as "Er" data, "A" data, "B" data, "C" data, . . . and "O" data in ascending order of their threshold voltages.

The threshold voltages for the memory cell transistors MT that hold the "Er" data are lower than the voltage VA, and corresponds to the data erase state. The threshold voltages for the memory cell transistors MT that hold the "A" data are greater than or equal to the voltage VA, and are smaller than VB (>VA). The threshold voltages for the memory cell transistors MT that hold the "B" data are greater than or equal to the voltage VB, and are smaller than VC (>VB)." The threshold voltages for the memory cell transistors MT that hold the "C" data are greater than or equal to the voltage VC, and are smaller than VD (>VC). The threshold voltages for the memory cell transistors MT that hold the "D" data are greater than or equal to the voltage VD, and are smaller than VE (>VD). The threshold voltages for the memory cell transistors MT that hold the "E" data are greater than or equal to the voltage VE, and are smaller than VF (>VE). The threshold voltages for the memory cell transistors MT that hold the "F" data are greater than or equal to the voltage VF, and are smaller than VG (>VF). The threshold voltages for the memory cell transistors MT that hold the "G" data are greater than or equal to the voltage VG, and are smaller than VH (>VG). The threshold voltages for the memory cell transistors MT that hold the "H" data are greater than or equal to the voltage VH, and are smaller than VI (>VH). The threshold voltages for the memory cell transistors MT that hold the "I" data are greater than or equal to the voltage VI, and are smaller than VJ (>VI). The threshold voltages for the memory cell transistors MT that hold the "J" data are greater than or equal to the voltage VJ, and are smaller than VK (>VJ). The threshold voltages for the memory cell transistors MT that hold the "K" data are greater than or equal to the voltage VK, and are smaller than VL (>VK). The threshold voltages for the memory cell transistors MT that hold the "L" data are greater than or equal to the voltage VL, and are smaller than VM (>VL). The threshold voltages for the memory cell transistors MT that hold the "M" data are greater than or equal to the voltage VM, and are smaller than VN (>VM). The threshold voltages for the memory cell transistors MT that hold the "N" data are greater than or equal to the voltage VN, and are smaller than VO (>VN). The threshold voltages for the memory cell transistors MT that hold the "O" data are greater than or equal to the voltage VO, and are smaller than VREAD. The "O" data of the 4-bit data is the data for which the threshold voltage is the highest.

The threshold distributions are obtained by writing the 4-bit (4-page) data including the lower bit, the upper bit, the higher bit, and the top bit. The relationship between the data expressed in "Er" and "A" to "O" and the lower/upper/higher/top bits can be presented as below:

"Er" data: "1111" (bits expressed in the order of "Top/Higher/Upper/Lower")
"A" data: "1110"
"B" data: "1010"
"C" data: "1000"
"D" data: "1001"
"E" data: "0001"
"F" data: "0000"
"G" data: "0010"
"H" data: "0110"
"I" data: "0100"
"J" data: "1100"
"K" data: "1101"
"L" data: "0101"
"M" data: "0111"
"N" data: "0011"
"O" data: "1011"

As shown above, the data corresponding to any adjacent two threshold levels differs from each other only in one bit of the four bits.

For this reason, reading of the lower bit can be accomplished by using the voltages corresponding to the borderlines on which the value of the lower bit changes (between "0" and "1"). The same applies to the reading of the upper bit, the higher bit, and the top bit.

In particular, as indicated in FIG. 5, in order to read the lower page, the voltage VA that differentiates between the "Er" data and the "A" data, the voltage VD that differentiates between the "C" data and the "D" data, the voltage VF that differentiates between the "E" data and the "F" data, and the voltage VK that differentiates between the "J" data and the "K" data may be used as readout levels. The read operations using the voltages VA, VD, VF, and VK will be referred to as read operations AR, DR, FR, and KR, respectively.

In the read operation AR, whether or not the threshold voltage of a memory cell transistor MT is smaller than the voltage VA (i.e., whether or not the held data is "Er") is determined. In the read operation DR, whether or not the threshold voltage of the memory cell transistor MT is smaller than the voltage VD is determined. In the read operation FR, whether or not the threshold voltage of the memory cell transistor MT is smaller than the voltage VF is determined. In the read operation KR, whether or not the threshold voltage of the memory cell transistor MT is smaller than the voltage VK is determined.

In order to read the upper page, the voltage VC that differentiates between the "B" data and the "C" data, the voltage VG that differentiates between the "F" data and the "G" data, the voltage VI that differentiates between the "H" data and the "I" data, and the voltage VM that differentiates between the "L" data and the "M" data may be used as readout levels. The read operations using the voltages VC, VG, VI, and VM will be referred to as read operations CR, GR, IR, and MR, respectively.

In the read operation CR, whether or not the threshold voltage of the memory cell transistor MT is smaller than the voltage VC is determined. In the read operation GR, whether or not the threshold voltage of the memory cell transistor MT is smaller than the voltage VG is determined. In the read operation IR, whether or not the threshold voltage of the memory cell transistor MT is smaller than the voltage VI is determined. In the read operation MR, whether or not the threshold voltage of the memory cell transistor MT is smaller than the voltage VM is determined.

In order to read the higher page, the voltage VB that differentiates between the "A" data and the "B" data, the voltage VH that differentiates between the "G" data and the "H" data, and the voltage VN that differentiates between the "M" data and the "N" data may be used as readout levels. The read operations using the voltages VB, VH, and VN will be referred to as read operations BR, HR, and NR, respectively.

In the read operation BR, whether or not the threshold voltage of the memory cell transistor MT is smaller than the voltage VB is determined. In the read operation HR, whether or not the threshold voltage of the memory cell transistor MT is smaller than the voltage VH is determined. In the read operation NR, whether or not the threshold voltage of the memory cell transistor MT is smaller than the voltage VN is determined.

In order to read the top page, the voltage VE that differentiates between the "D" data and the "E" data, the voltage VJ that differentiates between the "I" data and the "J" data, the voltage VL that differentiates between the "K" data and the "L" data, and the voltage VO that differentiates between the "N" data and the "0" data may be used as readout levels. The read operations using the voltages VE, VJ, VL, and VO will be referred to as read operations ER, JR, LR, and OR, respectively.

In the read operation ER, whether or not the threshold voltage of the memory cell transistor MT is smaller than the voltage VE is determined. In the read operation JR, whether or not the threshold voltage of the memory cell transistor MT is smaller than the voltage VJ is determined. In the read operation LR, whether or not the threshold voltage of the memory cell transistor MT is smaller than the voltage VL is determined. In the read operation OR, whether or not the threshold voltage of the memory cell transistor MT is smaller than the voltage VO (i.e. whether or not the held data is "0") is determined.

1.2 Write Operation
1.2.1 Outline of Write Operation

First, the outline of the write operation according to the present embodiment will be explained with reference to FIG. 6. The charts of FIG. 6 show threshold distributions for memory cell transistors MTs that are connected to the word lines WLi and WL(i+1). These charts represent how the thresholds of the memory cell transistors MTs connected to the word lines WLi and WL(i+1) vary at each processing step executed to write data in the memory cells MTs of the word lines WLi and WL (i+1) in the processing order. Here, i represents any integer from 0 to 6. Due to the space limitations of the charts, FIG. 6 shows only the threshold distributions for the "Er" to "C" data, but the distributions can also be observed in the "D" to "O" data.

The memory cell transistors MTs of the word lines WLi and WL (i+1) are in the initial state, and the thresholds of both transistors MTs are at the "Er" level. This is referred to as the first state. In the first state, the word line WLi is first selected, and data is written in the memory cell MT of the word line WLi. The program verify levels for this writing operation are set to VfyA', VfyB', VfyC', . . . and VfyO' which are lower than the finally targeted program verify levels VfyA, VfyB, VfyC, . . . and VfyO. As a result, data at the "A" level, "B" level, "C" level, . . . and "O" level are roughly written in the memory cell MT of the word line WLi. Hereinafter, this write operation is referred to as a "foggy write". The write data is transferred from the controller 200 to the NAND flash memory 100. The entire operation from the transfer of the write data to the foggy write will be referred to as the first write operation. In the first write operation, the same data is written in the cache block, which will be discussed later. The thresholds of the memory cells MT of the word lines WLi and WL (i+1) after the first write operation are set according to the threshold distributions as indicated in the second state in FIG. 6.

Next, in the second state, the first write operation is executed in a similar manner in the memory cell MT of the word line WL (i+1), which is adjacent to the word line WLi on the drain side, to achieve the foggy write. As a result of the foggy write for the memory cell of the word line WL(i+1), the threshold distributions on the memory cell of the word line WLi shift toward the positive voltage side due to the inter-cell interference effects. As a result, the thresholds of the memory cells MT are set according to the threshold distributions as indicated in the third state of FIG. 6.

Thereafter, the word line WLi is re-selected in the third state to write data in the memory cell MT of the word line WLi. The verify levels that are used for this writing are the finally targeted levels, i.e. the program verify levels VfyA, VfyB, VfyC, . . . and VfyO. At this point of time, because the data is already roughly written in the memory cell MT at the "A", "B", "C", . . . and "O" levels, only a slight amount of shift of the threshold voltages needs to be made in the write operation in the third state. Hereinafter, this operation is referred to as a "fine write". The data for the fine write operation is not provided from the controller 200, but the data that has been written in the cache blocks during the first write operation is read out and used. The entire operation from the reading of the data from the cache blocks to the fine write will be referred to as the second write operation. The resultant thresholds are distributed indicated as the fourth state.

Next, the second write operation is performed for the memory cell MT of the word line WL (i+1) in the fourth state in a manner similar to the above to execute the fine write. Because only a slight amount of shift is made for the threshold voltage in the fine write, the memory cell of the word line WLi will hardly be affected by the inter-cell interference effect. As a result, as indicated in the fifth state, the inter-cell interference effect is basically negligible when executing the write operation.

1.2.2 Detailed Description of First Write Operation

Next, the first write operation will be described in detail with reference to FIG. 7. The flowchart of FIG. 7 schematically shows the flow of the first write operation.

In general, the first write operation includes the following three steps: transferring data of 4-pages to the NAND flash memory 100 by the controller 200; writing the data to the cache blocks; and foggy writing.

Figure 7:
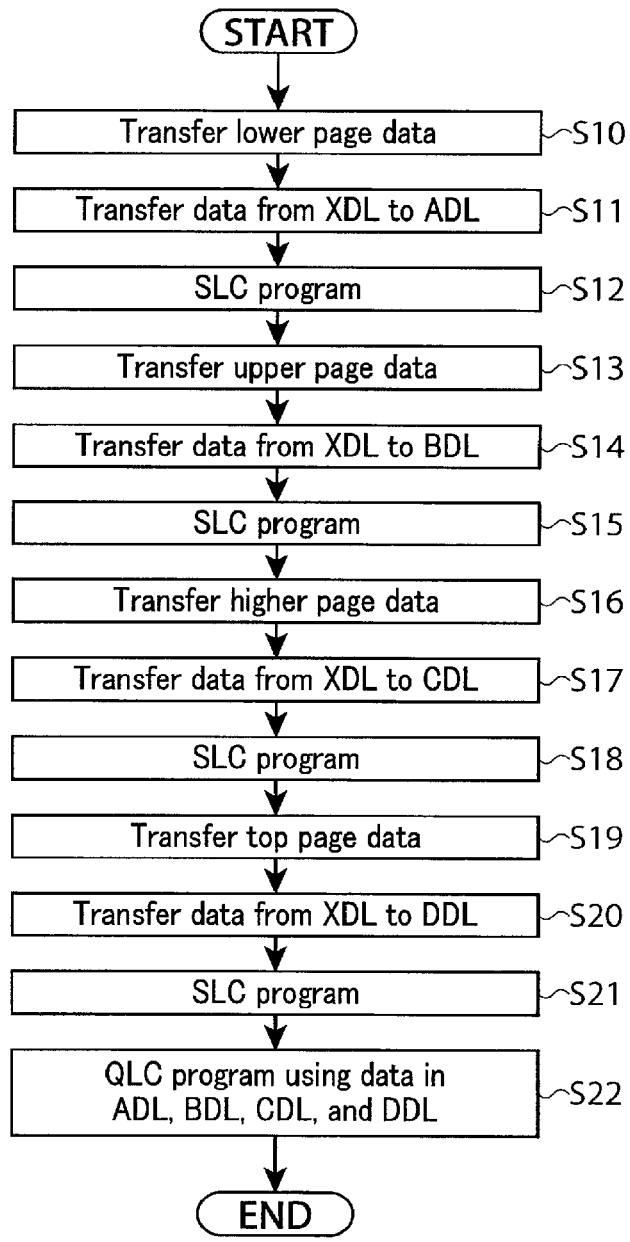
FIG. 7 is a flowchart of the write operation according to the first embodiment.

As shown in FIG. 7, the controller 200 first transfers the lower page data to the NAND flash memory 100 (Step S10). The received lower page data is initially held by the latch circuit XDL of the column controller 140, and then transferred, for example, to the latch circuit ADL (Step S11). Thereafter, the sequencer 170 uses one of the blocks BLKs as the cache block to write the lower page data of the ADL into the cache block (Step S12). In writing data to the cache block, a data of one bit is written in each memory cell of the cache block, and therefore this writing may be referred to as a "single level cell (SLC) programming".

The above operation is repeated for the upper page, the higher page, and the top page. Blocks BLK that are used as the cache blocks may be the same block for the pages, or may be different blocks for different pages.

In particular, the controller 200 transfers the upper page data to the NAND flash memory 100 (Step S13). The received upper page data is transferred from the latch circuit XDL, for example, to the latch circuit BDL (Step S14). The ADL continues to hold the lower page data. The sequencer 170 uses one of the blocks BLKs as the cache block for the SLC-programming of the upper page data in the BDL to the cache block (Step S15).

Next, the controller 200 transfers the higher page data to the NAND flash memory 100 (Step S16). The received higher page data is transferred from the latch circuit XDL, for example, to the latch circuit CDL (Step S17). The ADL and BDL continue to hold the lower page data and the upper page data, respectively. The sequencer 170 uses one of the blocks BLKs as the cache block for the SLC-programming of the higher page data in the CDL to the cache block (Step S18).

Thereafter, the controller 200 transfers the top page data to the NAND flash memory 100 (Step S19). The received top page data is transferred from the latch circuit XDL, for example, to the latch circuit DDL (Step S20). The ADL, BDL, and CDL continue to hold the lower page data, the upper page data, and the higher page data, respectively. The sequencer 170 uses one of the blocks as the cache block for the SLC-programming of the top page data in the DDL to the cache block (Step S21).

Then, the controller 200 issues commands for the foggy programming using the data held in the latch circuits ADL, BDL, CDL, and DDL, and sends the commands to the NAND flash memory 100. In response to these commands, the NAND flash memory 100 executes the foggy write onto one of the blocks BLKs (Step S22). Unlike in the SLC write, a data of 4 bits is written into one memory cell during the foggy write. Such writing may be referred to as a "quad level cell (QLC) programming". In addition, in order to differentiate the block BLK targeted for the QLC programming from the cache block, the block BLK targeted for the QLC program may be referred to as a QLC block.

1.2.3 Command Sequences and Example thereof for First Write Operation

Figure 8:
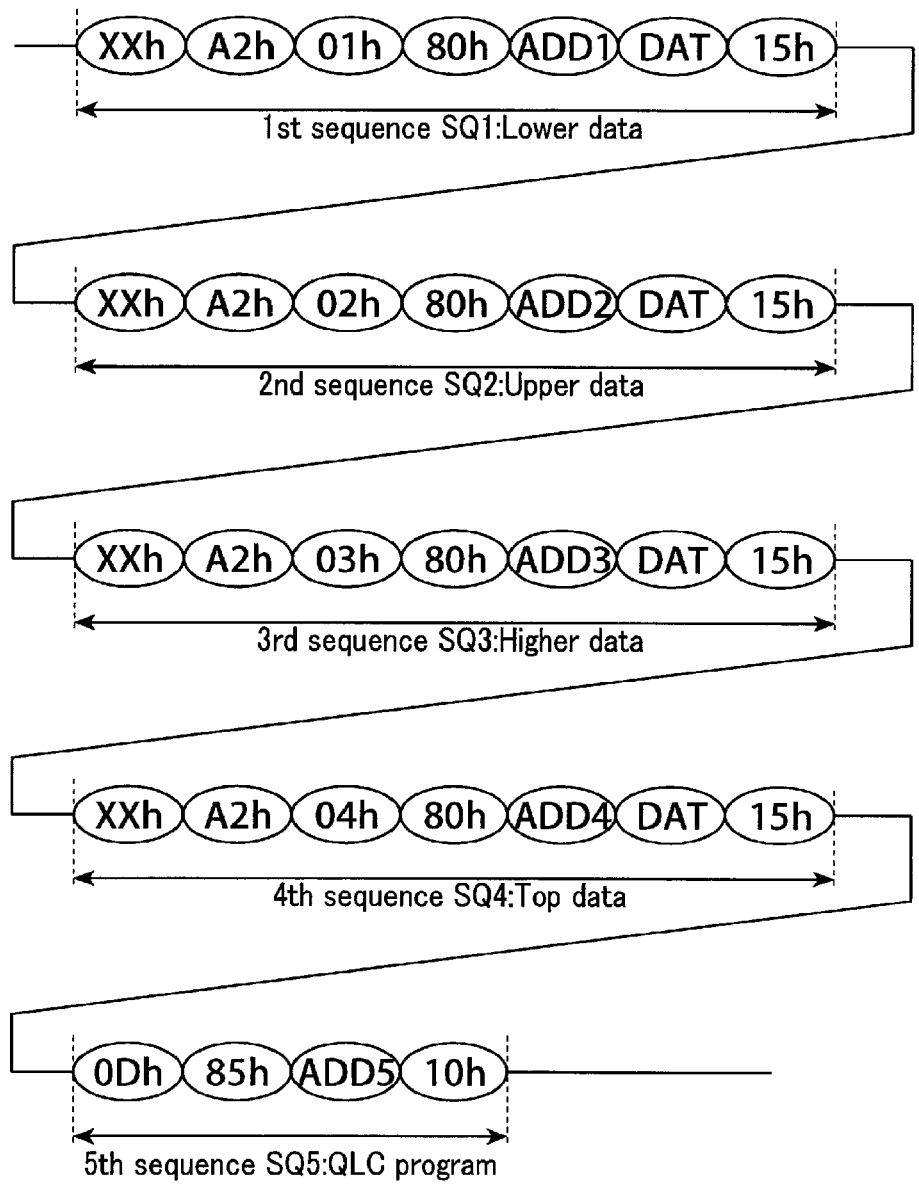
FIG. 8 shows command sequences in the write operation according to the first embodiment.

The command sequences for the first write operation and an example thereof will be described with reference to FIGS. 8 to 13. The command sequences at the time of executing the first write operation are shown in FIG. 8. FIGS. 9 to 13 illustrate the latch circuits ADL, BDL, CDL, DDL, and XDL, and the blocks BLK0 to BLK4 at the time of executing the first write operation.

First, as illustrated in FIG. 8, the controller 200 issues a first sequence SQ1, and sends it to the NAND flash memory 100. The first sequence SQ1 corresponds to Steps S10 to S12 of FIG. 7. In the first sequence SQ1, a prefix command "XXh" is first issued, and then a command "A2h" is issued. The command "A2h" is for an instruction of the SLC programming. Since the cache block is designated by an address which will be discussed later, the issuance of the "A2h" may be omitted. The command "01h" is issued next. The command "01h" is to designate the lower page. The prefix command "XXh" together with this "01h" instructs the transfer of the lower page data to the latch circuit ADL, and further notifies that the lower page data will be written. Thereafter, the controller 200 issues a command "80h" to notify that an address is input. Then, the controller 200 transmits the address ADD1, for example, over five cycles. The address ADD1 designates the cache block BLK and the page that are to be used for the SLC-programming of the lower page data. Then, the controller 200 transmits the lower page data DAT to the NAND flash memory 100, and finally issues a command "15h". This command "15h" is a command for programming the cache block.

Figure 9:
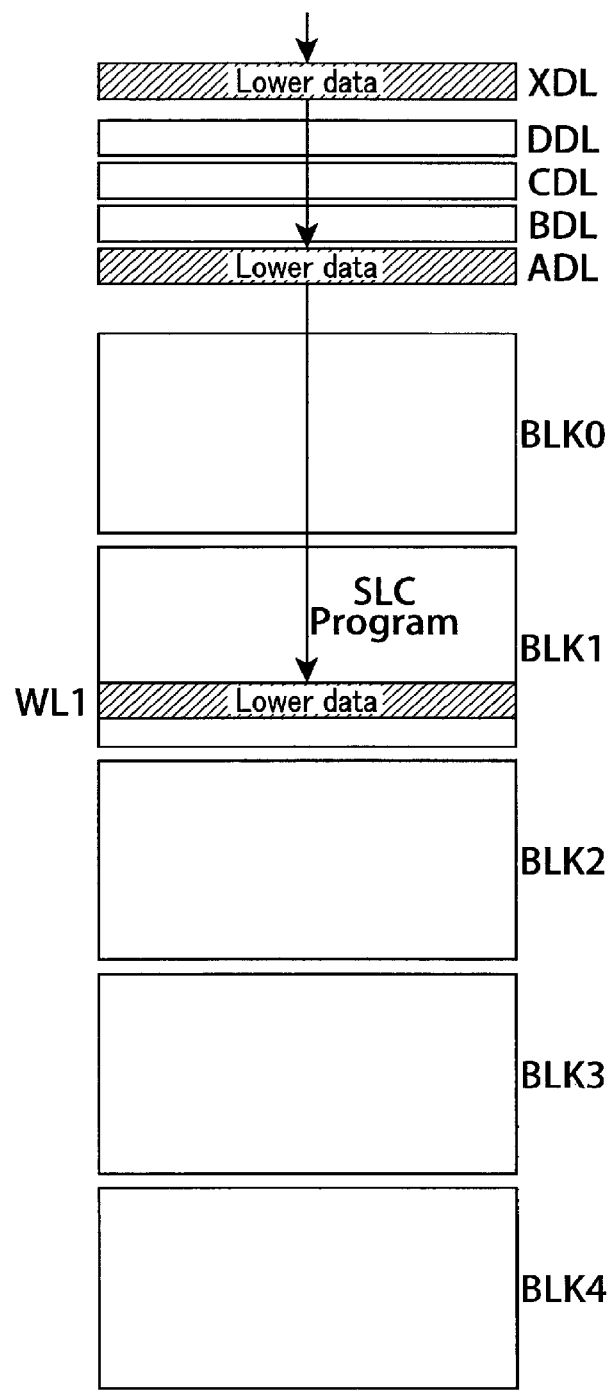

FIG. 9 shows the operation of the NAND flash memory 100 when the command "15h" of the first sequence SQ1 is issued. In this example supposing that the address ADD1 designates the word line WL1 of the block BLK1. As illustrated in FIG. 9, when the lower page data is held in the XDL, the NAND flash memory 100 turns to the busy state. As soon as the data in the XDL is transferred to the ADL, however, the NAND flash memory 100 returns to the ready state. Then, the sense amplifier SA applies voltages corresponding to the lower page data to the bit lines BL. The row decoder 120 selects a block BLK1 and also applies a program voltage to a word line WL1. In this manner, the lower page data is written to the cache block BLK1. This writing, of course, is implemented by the SLC programming.

Next, as illustrated in FIG. 8, after the NAND flash memory 100 returns to the ready state, the controller 200 issues a second sequence SQ2 and sends it to the NAND flash memory 100. The second sequence SQ2 corresponds to Steps S13 to S15 of FIG. 7. The second sequence SQ2 is different from the first sequence SQ1 in that:

"02h" is issued in place of "01h" to designate the upper page;

"XXh" together with "02h" instructs the transfer of the upper page data to the BDL, and notifies that the upper page data is written;

ADD2 is issued in place of ADD1 to designate the cache block BLK and the page that are used in the SLC-programming of the upper page data; and the data DAT is an upper page data.

FIG. 10 shows the operation of the NAND flash memory 100 corresponding to the second sequence SQ2. In this example supposing that the address ADD2 designates the word line WL1 of the block BLK2. As shown in FIG. 10, after the upper page data is stored in the XDL, the NAND flash memory 100 turns to the busy state. As soon as the data in the XDL is transferred to the BDL, however, the NAND flash memory 100 returns to the ready state. Thereafter, the upper page data is written into the cache block BLK2 (by the SLC programming).

Next, as illustrated in FIG. 8, after the NAND flash memory 100 returns to the ready state, the controller 200 issues a third sequence SQ3 and transmits it to the NAND flash memory 100. The third sequence SQ3 corresponds to Steps S16 to S18 of FIG. 7. The third sequence SQ3 is different from the first sequence SQ1 in that:

"03h" is issued in place of "01h" to designate the higher page;

"XXh" together with "03h" instructs the transfer of the higher page data to the CDL, and notifies that the higher page data is written;

ADD3 is issued in place of ADD1 to designate the cache block BLK and the page that are used in the SLC-programming of the higher page data; and the data DAT is a higher page data.

Figure 11:
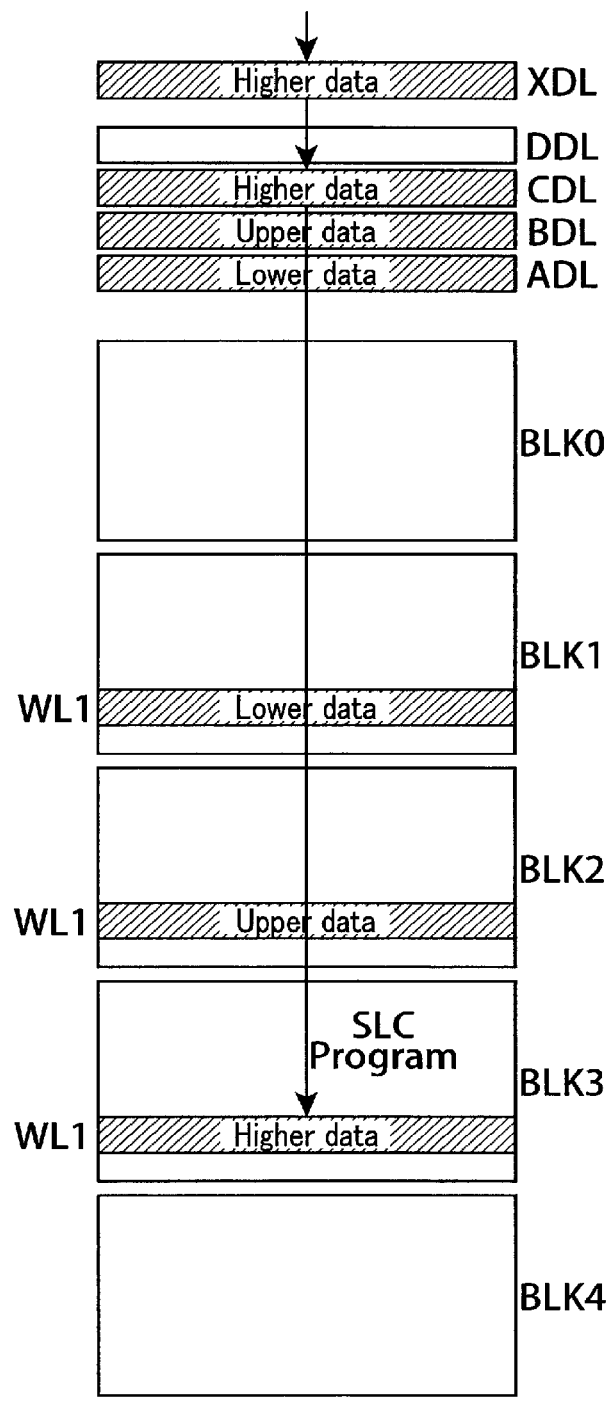

FIG. 11 shows the operation of the NAND flash memory 100 corresponding to the third sequence SQ3. In this example, supposing that the address ADD3 designates the word line WL1 of a block BLK3. As shown in FIG. 11, when the higher page data is held in the XDL, the NAND flash memory 100 turns to the busy state. As soon as the data in the XDL is transferred to the CDL, however, the NAND flash memory 100 returns to the ready state. Then, the higher page data is written to the cache block BLK3 (by SLC programming).

Thereafter, as illustrated in FIG. 8, after the NAND flash memory 100 returns to the ready state, the controller 200 issues a fourth sequence SQ4, and transmits it to the NAND flash memory 100. The fourth sequence SQ4 corresponds to Steps S19 to S21 of FIG. 7. The fourth sequence SQ4 is different from the first sequence SQ1 in that:

"04h" is issued in place of "01h" to designate the top page;

"XXh" together with "04h" instructs the transfer of the top page data to the DDL, and notifies that the top page data is written;

ADD4 is issued in place of ADD1 to designate the cache block BLK and the page that are used in the SLC-programming of the top page data; and the data DAT is a top page data.

Figure 12:
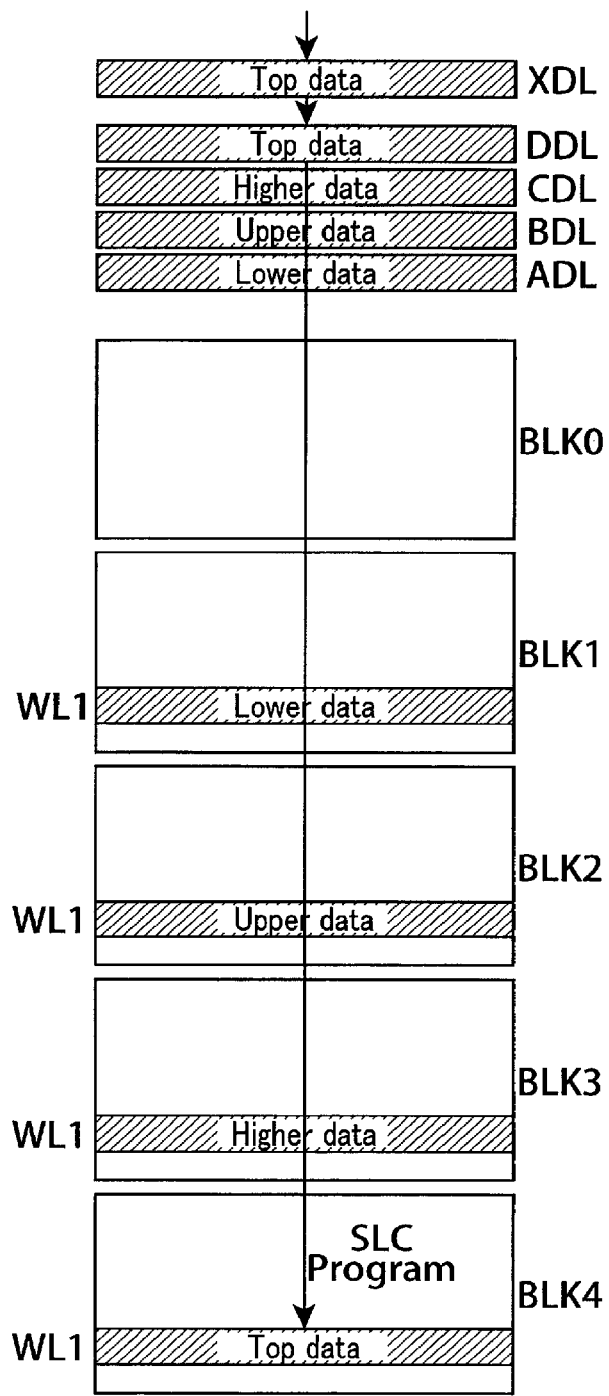

FIG. 12 shows the operation of the NAND flash memory 100 corresponding to the fourth sequence SQ4. In this example, supposing that the address ADD4 designates the word line WL1 of the block BLK4. As shown in FIG. 12, after the top page data is stored in the XDL, the NAND flash memory 100 turns to the busy state. As soon as the data in the XDL is transferred to the DDL, however, the NAND flash memory 100 returns to the ready state. Thereafter, the top page data is written to the cache block BLK4 (by SLC programming). At this point of time, the data necessary for the QLC programming are prepared in the ADL, BDL, CDL, and DDL.

Next, as illustrated in FIG. 8, after the NAND flash memory 100 is returned to the ready state, the controller 200 issues a fifth sequence SQ5, and transmits it to the NAND flash memory 100. The fifth sequence SQ5 corresponds to Step S22 of FIG. 7. In the fifth sequence SQ5, a command "0Dh" is first issued. The command "0Dh" designates a foggy write. Thereafter, the controller 200 issues a command "85h" to notify that an address is input. Then, the controller 200 transmits an address ADD5, for example, over five cycles. This address ADD5 designates the block BLK and page that are used for the QLC programming. Finally, a command "10h" is issued. The fifth sequence SQ5 does not include write data because the data to be written is already held in the column controller 140.

FIG. 13 shows the operation of the NAND flash memory 100 corresponding to the fifth sequence SQ5. In this example, supposing that the address ADD5 designates the word line WL1 of the QLC block BLK0. As shown in FIG. 13, upon receipt of the command "10h", the NAND flash memory 100 turns to a busy state. Then, the sense amplifier SA applies voltages corresponding to the 4-page data held in the ADL, BDL, CDL, and DDL to the bit lines BL. The row decoder 120 selects the block BLK0 and applies the program voltage to the word line WL1. In this manner, the data of 4 pages are written into the QLC block BLK0. This writing, of course, is implemented by the QLC programming. In addition, this writing is a foggy write, and therefore VfyA', VfyB', VfyC', . . . and VfyO' are used as program verify levels, as discussed with reference to FIG. 6.

Figure 14:
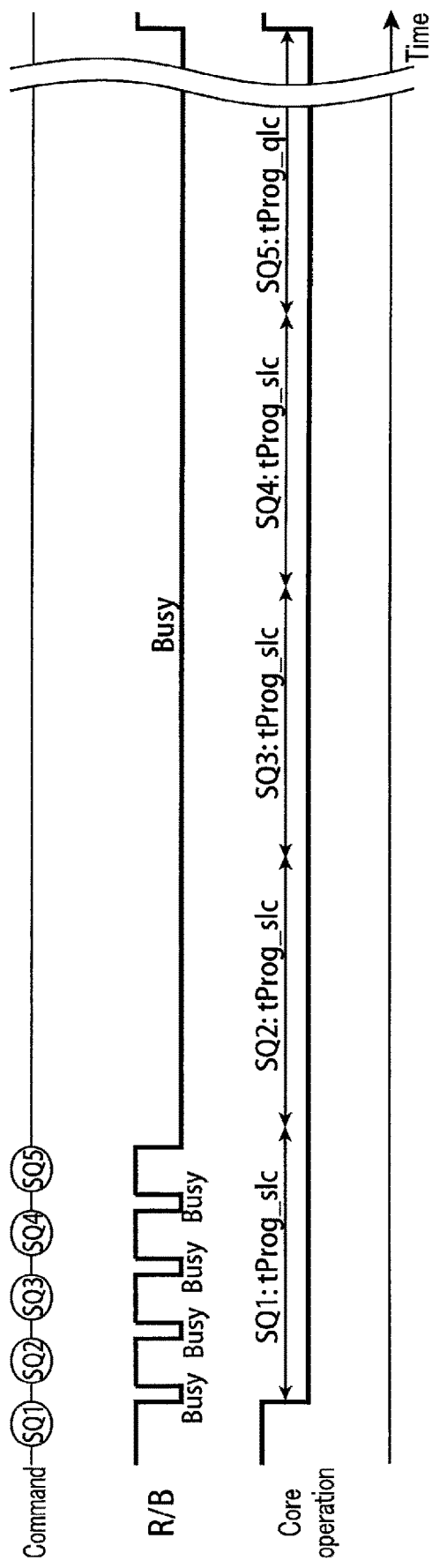
FIG. 14 is a timing chart showing command sequences, a ready/busy signal, and core operations in the write operation according to the first embodiment.

FIG. 14 is a timing chart representing the command sequences, a ready/busy signal, and core operations in the flow of the first write operation. As shown in FIG. 14, the first to fifth command sequences SQ1 to SQ5 are issued in turn. At each time when the command sequences are issued, the NAND flash memory 100 turns to the busy state. However, as described above, after the data is transferred from the XDL to another latch circuit, the NAND flash memory 100 immediately returns to the ready state. For example, even during the period of execution of the lower page programming in the core operation in response to receipt of the command sequence SQ1, since the NAND flash memory 100 immediately returns to the ready state, the controller 200 can transmit the next command sequence SQ2. Thus, the NAND flash memory 100 can continuously receive the command sequences SQ1 to SQ5 while a program is being executed in the core operation. After the command sequence SQ5 is received, the busy state is maintained until the QLC programming explained with reference to FIG. 13 is completed.

1.2.4 Detailed Description of Second Write Operation

The second write operation will be discussed in detail with reference to FIG. 15. The flowchart of FIG. 15 shows the flow of the second write operation.

The second write operation, in general, includes two steps: reading the data written in the first write operation out of the cache block and storing the read-out data in the column controller 140; and performing the fine writing by use of the read-out data.

As shown in FIG. 15, the sequencer 170 reads the lower page data out of the cache block in response to the command from the controller 200 (Step S30). The read-out lower page data is transferred by the column controller 140 to the latch circuit ADL without passing through the latch circuit XDL (Step S31).

The above operation is repeated for the upper page, the higher page, and the top page. The sequencer 170 reads the upper page data out of the cache block (Step S32), and transfers the data to the latch circuit BDL without passing through the latch circuit XDL (Step S33). The ADL continues to hold the lower page data.

Thereafter, the sequencer 170 reads the higher page data out of the cache block (Step S34), and transfers it, for example, to the latch circuit CDL without passing through the latch circuit XDL (Step S35). The ADL and BDL continue to hold the lower page data and upper page data, respectively.

Furthermore, the sequencer 170 reads the top page data out of the cache block (Step S36), and transfers it, for example, to the latch circuit DDL without passing through the latch circuit XDL (Step S37). The ADL, BDL, and CDL continue to hold the lower page data, upper page data, and higher page data, respectively.

Subsequently, in response to the command from the controller 200, the sequencer 170 executes the fine write onto the QLC block BLK using the read-out data held in the latch circuits ADL, BDL, CDL, and DDL (Step S38).

1.2.5 Command Sequences and Examples thereof in Second Write Operation

Figure 16:
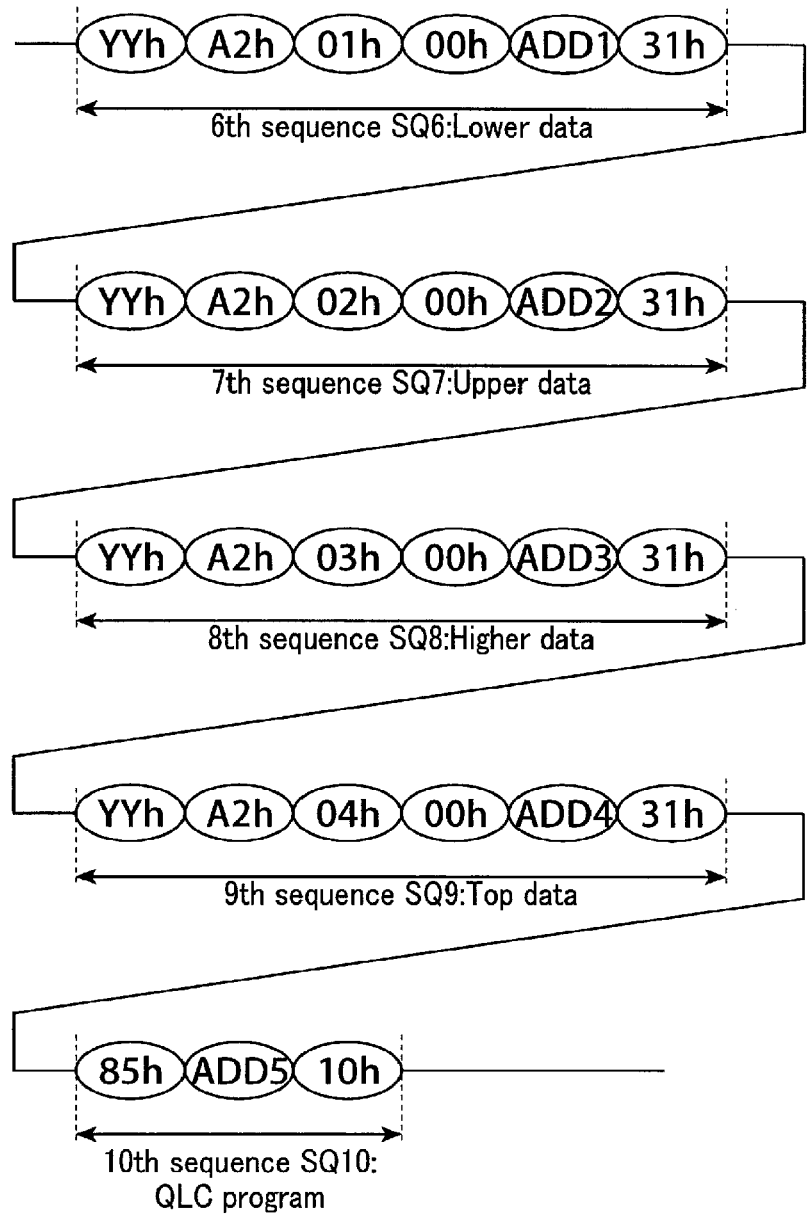
FIG. 16 shows command sequences in the write operation according to the first embodiment.

Next, the command sequences and examples thereof in the second write operation will be discussed with reference to FIGS. 16 to 20. FIG. 16 shows command sequences for the second write operation, and FIGS. 17 to 20 show the latch circuits ADL, BDL, CDL, DDL, and XDL, and blocks BLK0 to BLK4 in execution of the second write operation. FIGS. 16 to 20 will be explained for the operation that follows the first write operation explained with reference to FIGS. 8 to 13.

First, as illustrated in FIG. 16, the controller 200 issues the sixth sequence SQ6, and transmits it to the NAND flash memory 100. The sixth sequence SQ6 corresponds to Steps S30 and S31 of FIG. 15. In the sixth sequence SQ6, a prefix command "YYh" is first issued, and then a command "A2h" is issued. Like the first write operation, the issuance of "A2h" may be omitted. Next, a command "01h" is issued. The command "01h" designates the lower page. The prefix command "YYh" together with the "01h" designates the transfer of the lower page data to the latch circuit ADL, and also notifies that the lower page data is read. Subsequently, the controller 200 issues a command "00h" and notifies that an address is input. Then, the controller 200 transmits the address ADD1, for example, over five cycles. This address ADD1 designates the cache block BLK and the page from which the lower page data is read. In other words, the address ADD1 is the same as the address designated for writing the lower page data in the first write operation. Finally, the controller 200 issues a command "31h". This command "31h" is a cache read command.

Figure 17:
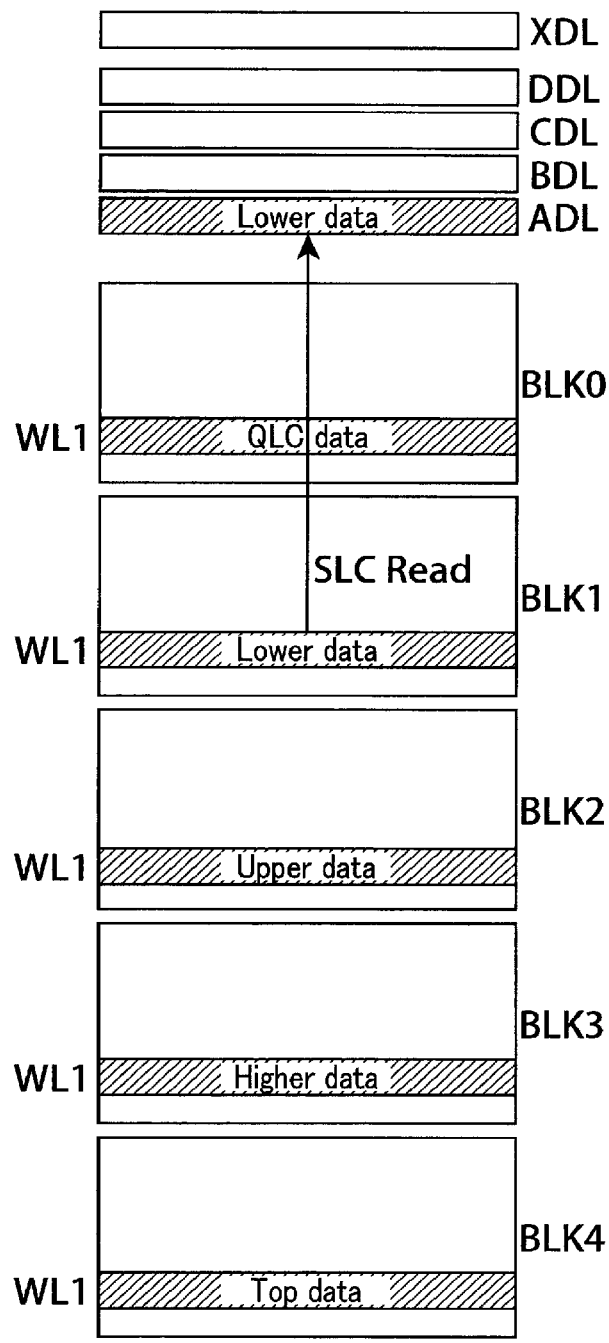
FIGS. 17, 18, 19, and 20 schematically illustrate the memory cell array and the column control circuit in the write operation according to the first embodiment.

FIG. 17 shows the operation of the NAND flash memory 100 when the command "31h" is issued in the sixth sequence SQ6. As shown in FIG. 17, the row decoder 120 selects the block BLK1, and applies the read voltage to the word line WL1. The lower page data is thereby read out to the sense amplifier SA. The read-out lower page data is transferred from the sense amplifier SA to the latch circuit ADL. Since the BLK1 is the cache block, the operation of reading from this block is done by determining whether the read-out data is "0" or "1". Such a read operation may be referred to as an "SLC read." Since this read operation does not employ the XDL, the NAND flash memory 100 that turns to the busy state upon receipt of the command "31h" can immediately return to the ready state.

Next, as illustrated in FIG. 16, after the NAND flash memory 100 returns to the ready state, the controller 200 issues a seventh sequence SQ7, and transmits it to the NAND flash memory 100. The seventh sequence SQ7 corresponds to Steps S32 and S33 of FIG. 15. The seventh sequence SQ7 is different from the sixth sequence SQ6 in that:

"02h" is issued in place of "01h" to designate the upper page;

"YYh" together with "02h" instructs the transfer of the upper page data to the BDL, and notifies that the upper page data is read.

ADD2 is issued in place of ADD1 to designate the cache block BLK and the page from which the upper page data is read.

Figure 18:
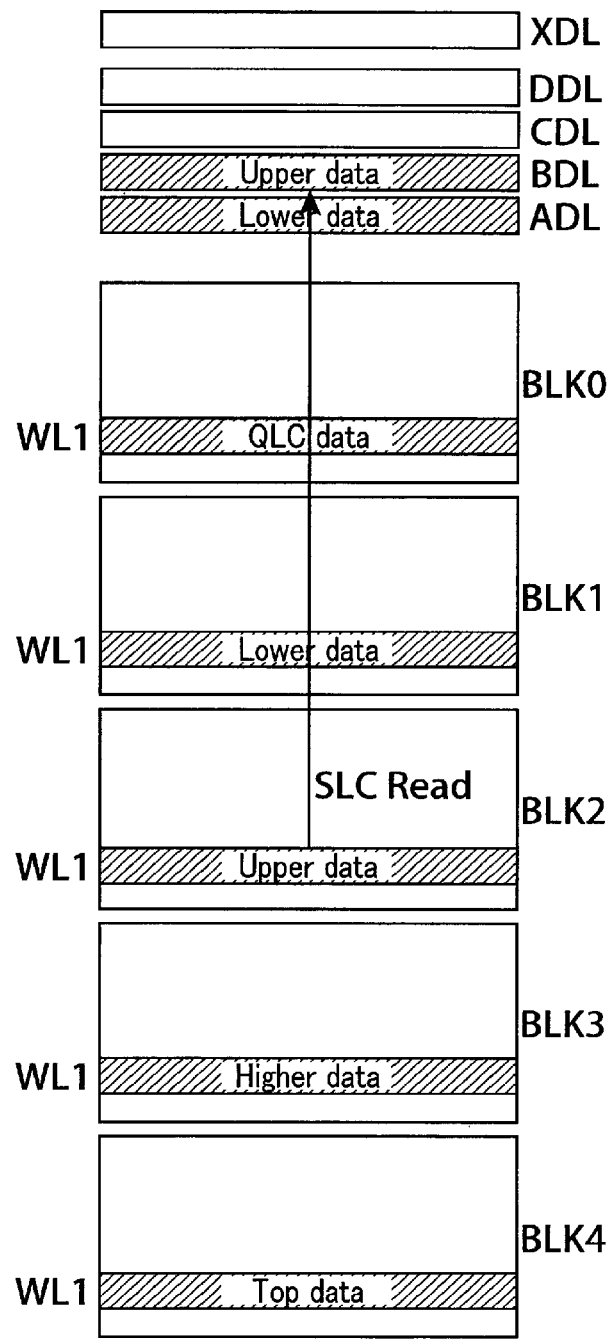

FIG. 18 shows the operation of the NAND flash memory 100 corresponding to the above seventh sequence SQ7. As shown in FIG. 18, the row decoder 120 selects the block BLK2, and applies the read voltage to the word line WL1. The upper page data is thereby read onto the sense amplifier SA. The read-out upper page data is transferred from the sense amplifier SA to the latch circuit BDL.

Next, as illustrated in FIG. 16, after the NAND flash memory 100 returns to the ready state, the controller 200 issues the eighth sequence SQ8, and transmits it to the NAND flash memory 100. The eighth sequence SQ8 corresponds to Steps S34 and S35 of FIG. 15. This eighth sequence SQ8 is different from the sixth sequence SQ6 in that:

"03h" is issued in place of "01h" to designate the higher page;

"YYh" together with the "03h" instructs the transfer of the higher page data to the CDL, and notifies that the higher page data is read; and ADD3 is issued in place of ADD1 to designate the cache block BLK and the page from which the higher page data is read.

Figure 19:
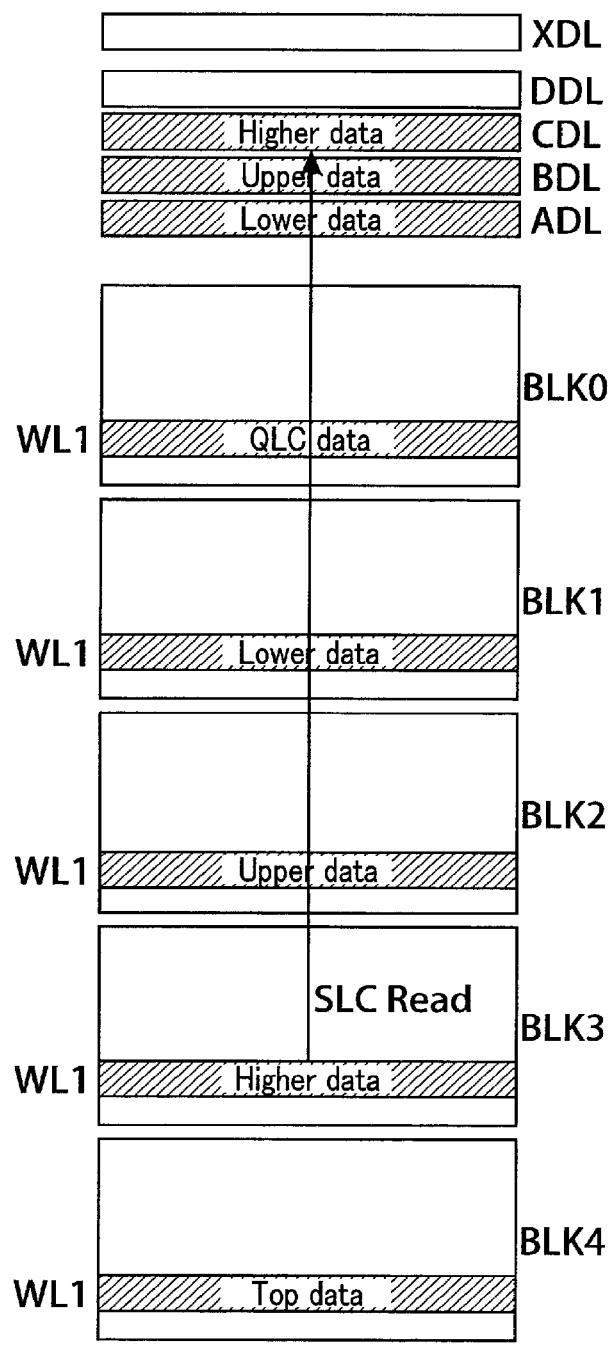

FIG. 19 shows the operation of the NAND flash memory 100 corresponding to the eighth sequence SQ8. As shown in FIG. 19, the row decoder 120 selects the block BLK3, and applies the read voltage to the word line WL1. The higher page data is thereby read to the sense amplifier SA. The read-out higher page data is transferred from the sense amplifier SA to the latch circuit CDL.

Next, as illustrated in FIG. 16, after the NAND flash memory 100 returns to the ready state, the controller 200 issues the ninth sequence SQ9 and transmits it to the NAND flash memory 100. The ninth sequence SQ9 corresponds to Steps S36 and S37 of FIG. 15. The ninth sequence SQ9 is different from the sixth sequence SQ6 in that:

"04h" is issued in place of "01h" to designate the top page;

"YYh" together with "04h" instructs the transfer of the top page data to the DDL, and notifies that the top page data is read; and ADD4 is issued in place of ADD1, and designates the cache block BLK and the page from which the top page data is read.

Figure 20:
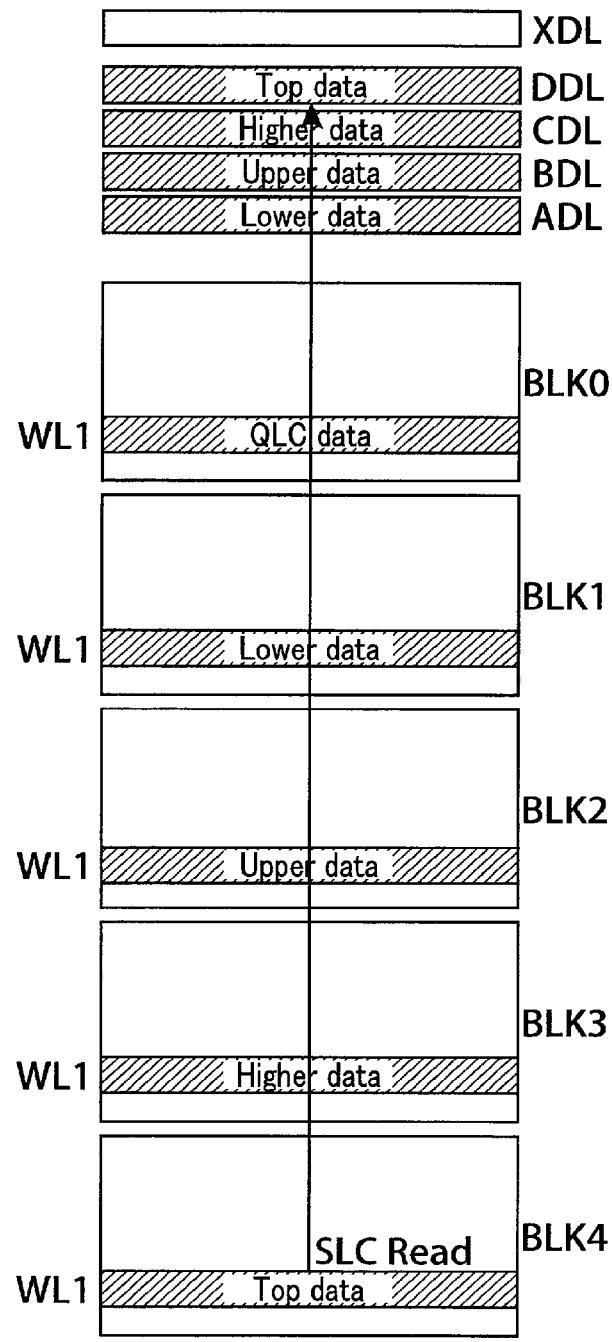

FIG. 20 shows the operation of the NAND flash memory 100 corresponding to the above ninth sequence SQ9. As shown in FIG. 20, the row decoder 120 selects the block BLK4 and applies the read voltage to the word line WL1. The top page data is thereby read to the sense amplifier SA. The read-out top page data is transferred from the sense amplifier SA to the latch circuit DDL.

Next, as illustrated in FIG. 16, after the NAND flash memory 100 returns to the ready state, the controller 200 issues the tenth sequence SQ10 and transmits it to the NAND flash memory 100. The tenth sequence SQ10 corresponds to Step S38 of FIG. 15. In the tenth sequence SQ10, the controller 200 first issues a command "85h" to notify that an address is input, and transmits the address ADD5, for example, over five cycles. This address ADD5 designates the block BLK and page on which the QLC-programming is performed. Finally, the command "10h" is issued. The tenth sequence SQ10 does not include write data since the data to be written has already been transferred from the cache block to the column controller 140. This operation is the same as the first write operation explained with reference to FIG. 13, and the only differences are that this writing is the fine write and therefore uses the program verify levels, VfyA, VfyB, VfyC, . . . and VfyO, as explained in FIG. 6, and that the XDL is not used.

Figure 21:
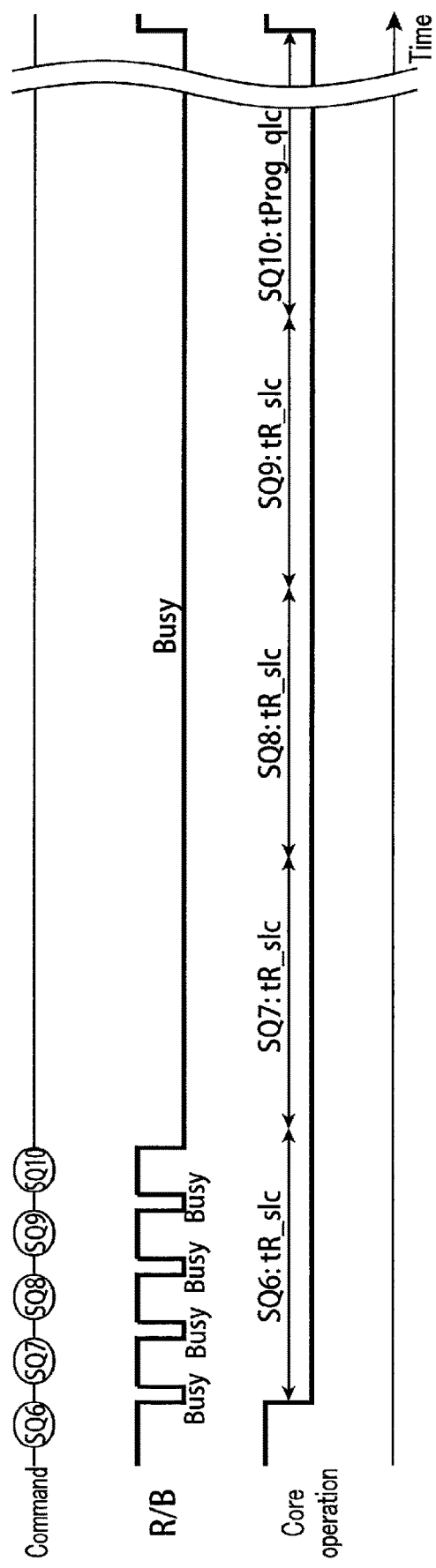
FIG. 21 is a timing chart showing command sequences, a ready/busy signal, and core operations in the write operation according to the first embodiment.

FIG. 21 is a timing chart representing command sequences, ready/busy signals, and core operations in the flow of the second write operation. As shown in FIG. 21, the sixth to tenth command sequences SQ6 to SQ10 are sequentially issued. As discussed above, while every time each sequence is issued, the NAND flash memory 100 turns to a busy state, the NAND flash memory 100 immediately returns to the ready state since the XDL is not used for the read-out data. For example, even during time when the reading of the lower page is being executed in the core operation upon receipt of the command sequence SQ6, the controller 200 can issue the next command sequence SQ7 since the NAND flash memory 100 immediately returns to the ready state. As such, even in execution of the core operation for the read operation, the NAND flash memory 100 can continuously receive the command sequences SQ6 to SQ10. After receiving the command sequence SQ10, the busy state is maintained until the QLC programming at Step S38 is completed.

1.3 Advantages Provided by Present Embodiment

According to the present embodiment, the buffer capacity of the controller can be reduced. This effect will now be explained.

According to the write method explained with reference to FIG. 6, the fine write to the word line WLi is performed after the foggy write to the word line WL (i+1) is completed. Thus, the write data to be written into the word line WLi may need to be held during the foggy write to the word line WL (i+1) after the write data is received from the host device 300.

According to the present embodiment, however, at the time of the foggy write, the write data is additionally SLC-programmed in the cache block. At the time of the fine write, the data SLC-programmed in the cache block is read out and used for write data. For this reason, during the foggy write for the word line WL (i+1), it is not necessary for the controller 200 to hold the write data for the word line WLi. This can reduce the capacity of the buffer memory (e.g., memory 240) that the controller 200 has.

In particular, as explained in the above embodiment, in a case where four pages are assigned to one word line WL, or in a case where a memory system operates on multi-planes, the size of the data that is required to be held for the fine write tends to be significantly large. The present embodiment provides more effective advantages for such instances.

At the time of the foggy write and the fine write, the write data of 4 pages is written in the cache blocks. Thus, even if the power of the NAND flash memory 100 is unexpectedly shut off during the write operation, it is not necessary for the NAND flash memory 100 to receive the write data again from the controller 200. It means that the controller 200 can delete the write data from its buffer memory after the writing of the write data into the cache blocks is completed. Furthermore, even in a case where the unexpected power shutdown occurs, the write data is prevented from being lost in the controller 200 and the NAND flash memory 100.

2. Second Embodiment

A memory system according to a second embodiment will now be explained. According to the second embodiment, pass/fail results of the write operation are determined in the write operation described for the first embodiment, using a status read command. The following explanation will focus only on the matters different from the first embodiment.

2.1 Status Read Command

A status read command is issued for each of the first write operation and the second write operation discussed in the first embodiment.

2.1.1 First Write Operation

Figure 22:
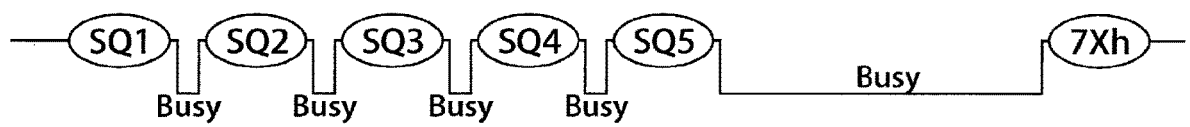
FIG. 22 shows command sequences in a write operation according to a second embodiment.

The first write operation will be explained. FIG. 22 is a timing chart representing command sequences and ready/busy states in the first write operation according to the second embodiment. This drawing corresponds to FIG. 14 for the first embodiment.

In this example of FIG. 22, when in the first write operation, the foggy write is completed, and after the NAND flash memory 100 returns to the ready state, the controller 200 issues a status read command "7Xh", and transmits it to the NAND flash memory 100.

When the command "7Xh" is stored in the command register 160, the controller 200 provides the NAND flash memory 100 with information of 8-bit data regarding the first write operation. This 8-bit data is shown in FIG. 23. The 8-bit data provides the following information to the controller 200, as shown in in the first write operation:

- IO0 (least significant bit) indicating whether the latest Nth multi-level writing (i.e. the QLC programming in this example) (where N is a natural number) passes or fails, with "0" when passes, and "1" when fails;
- IO1 indicating whether the second latest (N-1)th SLC programming (for the top page data in this example) passes or fails, with "0" when passes, and "1" when fails;
- IO2 indicating whether the third latest (N-2)th SLC programming (for the higher page data in this example) passes or fails, with "0" when passes, and "1" when fails;
- IO3 indicating whether the fourth latest (N-3)th SLC program (for the upper page data in this example) passes or fails, with "0" when passes, and "1" when fails;
- IO4 indicating whether the fifth latest (N-4)th SLC programming (for the lower page data in this example) passes or fails, with "0" when passes, and "1" when fails;
- IO05 providing True Busy or True Ready information (=True Ready: "1");
- IO6 providing Cache Busy or Cache Ready information (=Cache Ready: "1"); and
- IO7 providing Write Protect information (=no write protect: "1").

What is required in the present example is to obtain information regarding the QLC programming and the SLC programming. This means that the least significant two bits of the 8-bit data should be cared about. Examples of the information transmitted from the NAND flash memory 100 to the controller 200 may include the following cases:

Case 1: "E0"=1110_0000,

"E0" indicates that the QLC programming and the SLC programming are both passed, and thus, the controller 200 can proceed to the first write operation for the word line WL(i+1).

Case 2: "E1"=1110_0001,

"E1" indicates that the SLC programming passes but the QLC programming fails, and the controller 200 therefore reissues the fifth sequence SQ5 aforementioned with reference to FIG. 8 to retry the QLC programming at Step S22, wherein the address for writing is changed, and the changed address for writing may be a different word line WL in the same block BLK, or a word line WL in a different block BLK.

Case 3: "E2"=1110_0010,

"E2" indicates that the QLC programming passes but the SLC programming fails, and the controller 200 therefore reissues the fourth sequence SQ4 aforementioned with reference to FIG. 8 to retry the SLC program for the top page data at Steps S19 to S21, wherein the address for writing is changed, and the changed address for writing may be a different word line WL in the same cache block BLK, or a word line WL in a different cache block BLK. In case of "E2", the controller 200 recognizes that the address for writing the top data is changed, and issue an address included in the ninth sequence SQ9 in the second write operation to reflect the change.

This case is not limited to "E2". If the SLC programming for the lower page fails, the data is expressed as "1111_0000", and if the SLC programming for both the lower page and the upper page fails, the data is expressed as "1111_1000".

Case 4: "E3"=1110_0011,

"E3" indicates that the QLC programming and the SLC programming both fails, and the controller 200 therefore reissues the fourth sequence SQ4 aforementioned with reference to FIG. 8 to retry the SLC programming for the top page data. This operation is the same as the case of "E2". Furthermore, the controller 200 reissues the fifth sequence SQ5 aforementioned with reference to FIG. 8 to retry the QLC program at Step S22. This is the same as the case of "E1".

The case is not limited to "E3". If both the SLC programming and the QLC programming for the lower page fail, the data is expressed as "1111_0001", and if both the SLC programming and the QLC programming for the lower page and the upper page fail, the data is expressed as "1111_1001".

2.1.2 Second Write Operation

Next, the second write operation will be explained. FIG. 24 is a timing chart showing command sequences and ready/busy states in the second write operation according to the present embodiment. FIG. 24 corresponds to FIG. 21 described for the first embodiment.

In this example, after the fine write is completed in the second write operation and the NAND flash memory 100 returns to the ready state, the controller 200 issues a status read command "7Xh" and transmits it to the NAND flash memory 100, as shown in this FIG. 24.

When the command "7Xh" is stored in the command register 160, the controller 200 provides the NAND flash memory 100 with information regarding the second write operation in an 8-bit data. The content of the 8-bit data is explained with reference to FIG. 23.

What is required in the second write operation is the information regarding the QLC programming. This means that the least significant bit (IO0) of the 8-bit data shown in FIG. 23 should be cared about. That is, if the least significant bit is "1", the controller 200 reissues the tenth sequence SQ10 aforementioned with reference to FIG. 16, and thereby retries the fine write to a different address (which may be in the same block or a different block).

2.2 Advantages Provided by Second Embodiment

According to the second embodiment, since whether the QLC programming and the latest SLC programming pass or fail can be recognized, the reliability in data writing is improved.

In the example of FIG. 22, the status command "7Xh" may be issued after any of the first to fourth sequences SQ1 to SQ4. As such, the pass/fail information regarding the page programming for any page in addition to the top page can be obtained. If the SLC programming fails in any of the sequences, sequences from the sequence for the failed page programming are retried without the fifth sequence being issued.

3. Modification Examples

The memory system according to the above embodiments includes a semiconductor memory configured to store data therein and a controller configured to control data reading or writing for the semiconductor memory. The semiconductor memory includes a plurality of first blocks (SLC blocks) having memory cells configured to hold data of 1 bit, a second block (QLC block) having memory cells configured to hold data of 2 bits or more, and a sense amplifier (140) having a first latch circuit (ADL) and a second latch circuit (BDL). In the write operation, the controller issues a 1-page first data, a first write command (SQ1 in FIG. 8), a 1-page second data, a second write command (SQ2 in FIG. 8), and a third write command (SQ5 in FIG. 8). The semiconductor memory holds the first data in the first latch circuit, writes the first data in one of the first blocks in page units (SLC programming in FIG. 9), holds the second data in the second latch circuit, writes the second data in one of the first blocks in page units (SLC programming in FIG. 10), and upon receipt of the third write command, writes data of at least 2 pages in the second block, using the first data in the first latch circuit and the second data in the second latch circuit (QLC foggy programming in FIG. 12).

In addition, in the write operation, after the controller issues the third write command (SQ5), the controller issues a first read command (SQ6 in FIG. 16), a second read command (SQ7 in FIG. 16), and a fourth write command (SQ10 in FIG. 16). The semiconductor memory reads, in response to the first read command, the first data from any of the first blocks into the first latch circuit (SLC read in FIG. 17); reads, in response to the second read command, the second data from any of the first blocks into the second latch circuit (SLC read in FIG. 18); and writes, in response to the fourth write command, data of at least 2 pages into the second block, using the first data and the second data read to the first latch circuit and the second latch circuit (QLC fine programming).

With the above-described configuration, one of the blocks is used for a cache so that the capacity of the buffer memory of the controller can be reduced.

It should be noted that the embodiments explained above merely by way of examples of the present invention, and therefore various modifications may be made to the embodiments. For example, an example is described according to the embodiments in the case where the lower page data, the upper page data, the higher page data, and the top page data are written into different cache blocks BLK1 to BLK4. The embodiments should not be limited to the case, however. The entire data of pages may be written into the same cache block BLK. Alternatively, 2- or 3-page data of the entire data may be written into the same cache block BLK, and the data of the remaining pages may be written into a different cache block BLK.

Alternatively, the string units SUs of a cache block BLK may be assigned to each page in advance, which is shown in FIG. 25. In this example, the string units SU0 to SU3 of the cache block BLK1 correspond to the string unit SU0 of the QLC block BLK0. In particular, the four pages assigned to the word line WL1 in the string units SU0 to SU3 of the cache block BLK1 correspond to the four pages assigned to the word line WL1 in the string unit SU0 of the QLC block BLK0. In other words, when writing 4-bit data into the memory cells on the word line WL1 in the string unit SU0 of the block BLK0, the block BLK1 is selected for the cache block, and the lower page data, the upper page data, the higher page data, and the top page data are SLC-programmed in the memory cells on the word line WL1 in the string units SU0 to SU3, respectively, of the cache block BLK1.

In addition, in the example of FIG. 25, the string units SU0 to SU3 of the cache block BLK2 correspond to the string unit SU1 of the QLC block BLK0. In particular, the four pages assigned to the word line WL1 in the string units SU0 to SU3 of the cache block BLK2 correspond to the four pages assigned to the word line WL1 in the string unit SU1 of the QLC block BLK0. By setting such correspondence between the blocks, the controller 200 is allowed to easily manage the correspondence between the QLC block and the cache blocks.

The correspondence between the lower page data, upper page data, higher page data, and top page data, and the latch circuits ADL, BDL, CDL, and DDL in the column controller 140 may also be determined in advance in the NAND flash memory 100. The method for determining the correspondence is not limited to the above aspect.

Each memory cell transistor MT holds a 4-bit data is described by way of examples of the above-described embodiments, but the data held by the memory cell transistor MT may be a data of 3 bits or less, or a data of 4 or more bits. As for the cache block, the above examples adopt the SLC program; however, two-bit data may be written in. The advantages explained above can be obtained if the data of the SLC block has any number of bits smaller than the number of bits of a targeted block into which the data is finally written (e.g., 4 bits in the QLC block according to the above embodiments).

A memory cell transistor MT holding 3-bit data will be briefly described below. FIG. 26 shows a data held in the memory cell transistor MT, threshold voltages, and readout levels of the data. As shown in FIG. 26, the memory cell transistor MT holds "Er" data, "A" data, "B" data, "C" data, "D" data, "E" data, "F" data, and "G" data in increasing order of the threshold voltage. The lower page is determined by the read operations AR and ER, the middle page is determined by the read operations BR, DR, and FR, and the upper page is determined by the read operations CR and GR.

Figure 27:
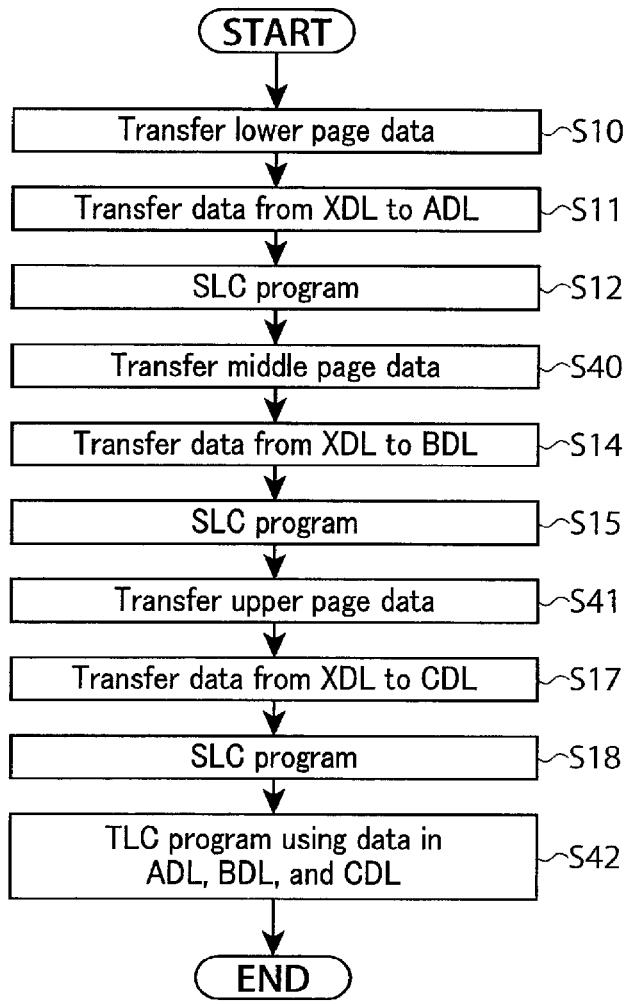

FIGS. 27 and 28 are flowcharts of the first write operation and second write operation of this example. This first write operation differs from the counterpart of the first embodiment illustrated in FIG. 7 in that the data received from the controller 200 and SLC-programmed into the cache block BLK is not 4-page data but 3-page data (constituting lower/middle/upper pages), and that in the foggy write, triple level cell (TLC) programming is performed using the 3-page data held in three latch circuits (ADL, BDL, and CDL in the example of FIG. 27).

The second write operation differs from the counterpart of the first embodiment illustrated in FIG. 15 in that the data read from the cache block BLK is not 4-page data but 3-page data (constituting lower/middle/upper pages), and that in the fine write, the TLC programming is performed using the 3-page data held in three latch circuits (ADL, BDL, and CDL in FIG. 27).

Note that in each embodiment concerning the present invention, (1) When the memory cell holds 2-bit data ("Er", "A", "B", and "C"), the voltage applied to the selected word line in the read operation of A level may range from, for example, 0 V to 0.55 V. However, the present invention is not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the read operation of B level may range from, for example, 1.5 V to 2.3 V. However, the voltage is not limited to this and may be set with any one of the ranges of 1.65 V to 1.8 V, 1.8 V to 1.95 V, 1.95 V to 2.1 V, and 2.1 V to 2.3 V.

The voltage applied to the selected word line in the reading operation of C level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A period of time (tR) of the read operation may be set within the range of, for example, 25 µs to 38 µs, 38 µs to 70 µs, or 70 µs to 80 µs.

(2) A write operation may include a program operation and a verify operation. In the write operation, the voltage first applied to the selected word line in the program operation may range from, for example, 13.7 V to 14.3 V. The voltage is not limited to this and may be set within any one of the ranges of, for example, 13.7 V to 14.0 V and 14.0 V to 14.6 V.

The voltage first applied to the selected word line when write accessing an odd-numbered word line and the voltage first applied to the selected word line when write accessing an even-numbered word line may be different.

If the program operation is an Incremental Step Pulse Program (ISPP), the voltage of step-up may be, for example, 0.5 V.

The voltage applied to an unselected word line may be set within the range of, for example, 6.0 V to 7.3 V. However, the voltage is not limited to this and may be set within the range of, for example, 7.3 V to 8.4 V or set to 6.0 V or less.

The pass voltage to be applied may be changed depending on whether the unselected word line is an odd-numbered word line or an even-numbered word line.

A period of time (tProg) of the writing operation may be set within the range of, for example, 1,700 µs to 1,800 µs, 1,800 µs to 1,900 µs, or 1,900 µs to 2000 µs.

(3) In an erase operation, the voltage first applied to a well that may be formed in the upper portion of the semiconductor substrate, and above which the memory cell may be arranged, may be set within the range of, for example, 12 V to 13.6 V. However, the voltage is not limited to this, and may be set within the range of, for example, 13.6 V to 14.8 V, 14.8 V to 19.0 V, 19.0 V to 19.8 V, or 19.8 V to 21 V.

A period of time (tErase) of the erase operation may be set within the range of, for example, 3,000 µs to 4,000 µs, 4,000 µs to 5,000 µs, or 4,000 µs to 9,000 µs.

(4) The structure of the memory cell

A charge storage layer may be arranged on a 4- to 10-nanometer thick tunnel insulating film on the semiconductor substrate (silicon substrate). The charge storage layer may have a stacked structure of a 2- to 3-nanometer thick insulating film of SiN or SiON and 3- to 8-nanometer thick polysilicon. A metal such as Ru may be added to the polysilicon. An insulating film is provided on the charge storage layer. The insulating film may include a 4- to 10-nanometer thick silicon oxide film sandwiched between a 3- to 10-nanometer thick lower High-k film and a 3- to 10-nanometer thick upper High-k film. As the High-k film, HfO or the like may be used. The silicon oxide film may be thicker than the High-k film. A 30- to 70-nanometer thick control electrode may be formed on a 3- to 10-nanometer thick work function adjusting material on the insulating film. Here, the work function adjusting material may be a metal oxide film such as TaO or a metal nitride film such as TaN. As the control electrode, W or the like may be used.

An air gap may be formed between the memory cells.

In the above embodiments, a NAND flash memory has been exemplified as the semiconductor storage device. However, the embodiments may be applicable not only to a NAND flash memory, but also to other general semiconductor memories, and also to various kinds of storage devices other than the semiconductor memories. In the flowcharts described in the above embodiments, the order of operations may be changed as needed.

While certain embodiments have been described, these embodiments have been presented as examples only, and are not intended to limit the scope of the inventions. Indeed, the novel embodiments described herein may be embodied in a various other forms; furthermore, various omissions, substitutions, and modifications in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory including a first plurality of memory cells, a first word line connected to gates of the first plurality of memory cells, a second plurality of memory cells, a second word line electrically connected to gates of the second plurality of memory cells, a third plurality of memory cells, a third word line connected to gates of the third plurality of memory cells, a first latch circuit, and a second latch circuit, each of the first plurality of memory cells being capable of storing data of one bit, each of the second plurality of memory cells being capable of storing data of one bit, each of the third plurality of memory cells being capable of storing data of two or more bits; and
a controller configured to write data of two or more bits into the semiconductor memory by performing a first write operation and a second write operation,
wherein in the first write operation, the controller is configured to send first data of one page and a first write command, second data of one page and a second write command, and a third write command, the semiconductor memory is configured to store the first data in the first latch circuit, and store the second data in the second latch circuit, and write the first data into the first plurality of memory cells in page units, and write the second data into the second plurality of memory cells in page units, and when receiving the third write command, the semiconductor memory is configured to write data including the first data stored in the first latch circuit and the second data stored in the second latch circuit into the third plurality of memory cells, wherein in the second write operation, after sending the third write command, the controller is configured to send a first read command, a second read command, and a fourth write command designating the third word line, and the semiconductor memory is configured to read the first data from the first plurality of memory cells to the first latch circuit in response to the first read command, read the second data from the second plurality of memory cells to the second latch circuit in response to the second read command, and overwrite data including the first data and the second data that are read to the first latch circuit and the second latch circuit in the third plurality of memory cells in response to the fourth write command, wherein a verify voltage that is used when the data is written in response to the fourth write command is higher than a verify voltage that is used when the data is written in response to the third write command, and each of the first data and the second data is data of one bit.

2. The system according to claim 1, wherein the semiconductor memory further includes a third latch circuit, and in the first write operation, the first data received from the controller is stored in the third latch circuit and thereafter transferred to the first latch circuit, and the second data received from the controller is stored in the third latch circuit after the first data is transferred from the third latch circuit to the first latch circuit, and thereafter transferred to the second latch circuit.

3. The system according to claim 2, wherein, in the second write operation, the first data and the second data read in response to the first read command and the second read command are stored in the first latch circuit and the second latch circuit without passing through the third latch circuit.

4. The system according to claim 3, wherein the first latch circuit is associated in advance with the first data and the second latch circuit is associated in advance with the second data.

5. The system according to claim 1, wherein, if writing to the first plurality of memory cells and/or the second plurality of memory cells in response to the first write command and/or the second write command fails, the controller is configured not to send the third write command.

6. The system according to claim 1, wherein the semiconductor memory further includes a fourth plurality of memory cells and a fourth word line electrically connected to gates of the fourth plurality of memory cells, each of the fourth plurality of memory cells being capable of storing data of two or more bits, if the data writing in response to the third write command fails, the controller is configured to re-send the third write command, and when receiving the re-sent third write command, the semiconductor memory is configured to write data including the first data stored in the first latch circuit and the second data stored in the second latch circuit into the fourth plurality of memory cell.

7. The system according to claim 6, wherein the controller is configured to designate the fourth word line when sending the fourth write command.

8. The system according to claim 1, wherein the semiconductor memory further includes a fourth plurality of memory cells, a fourth word line electrically connected to gates of the fourth plurality of memory cells, a fifth plurality of memory cells, and a fifth word line electrically connected to gates of the fifth plurality of memory cells, each of the fourth plurality of memory cells being capable of storing data of one bit, each of the fifth plurality of memory cells being capable of storing data of one bit, wherein if the data writing in response to the first write command and/or the second write command fails, the controller is configured to re-send the first write command and/or and the second write command, the semiconductor memory is configured to store the first data in the first latch circuit, and the second data in the second latch circuit, and write the first data into the fourth plurality of memory cells in page units, and the second data into the fifth plurality of memory cells in page units.

9. The system according to claim 1, wherein the semiconductor memory further includes a fourth plurality of memory cells and a fourth word line electrically connected to gates of the fourth plurality of memory cells, each of the fourth plurality of memory cells being capable of storing data of two or more bits, one of the fourth plurality of memory cells and one of the plurality of memory cells are connected in series, and the controller is configured to perform the second write operation for the third plurality of memory cells after performing the first write operation for the fourth plurality of memory cells.

10. The system according to claim 9, wherein the controller is configured to perform the first write operation for the fourth plurality of memory cells after performing the first write operation for the third plurality of memory cells.

11. The system according to claim 1, wherein the second write operation is performed without sending write data from the controller.

12. The system according to claim 1, wherein the semiconductor memory further includes a third latch circuit to hold data received from the controller before the received first data is stored in the first latch circuit and the received second data is stored in the second latch circuit, and the semiconductor memory is configured to overwrite the data to the third plurality of memory cells in the second write operation without use of the third latch circuit.

13. The system according to claim 1, wherein a threshold value of one of the third plurality of memory cells is increased by overwriting into the third plurality of memory cells in the second write operation.

14. The system according to claim 1, wherein the semiconductor memory includes a first block, a second block, and a third block, the first plurality of memory cells are included in the first block, the second plurality of memory cells are included in the second block, and the third plurality of memory cells are included in the third block.

15. The system according to claim 1, wherein the semiconductor memory includes a first block and a second block,
- the first plurality of memory cells are included in the first block,
- the second plurality of memory cells are included in the first block, and
- the third plurality of memory cells are included in the second block.

16. The system according to claim 6, wherein the semiconductor memory includes the plurality of blocks, each of the plurality of blocks being a unit of data erasing, and
- the fourth plurality of memory cells are included in a same block as the third plurality of memory cells.

17. The system according to claim 1, wherein each of the third plurality of memory cells is capable of storing data of four bits,
- wherein the semiconductor memory further includes a fourth plurality of memory cells, a fourth word line electrically connected to gates of the fourth plurality of memory cells, a fifth plurality of memory cells, a fifth word line electrically connected to gates of the fifth plurality of memory cells, a third latch circuit and a fourth latch circuit,
- wherein each of the fourth plurality of memory cells is capable of storing data of one bit,
- wherein each of the fifth plurality of memory cells is capable of storing data of one bit,
- wherein each of the third plurality of memory cells is capable of storing data of fourth bits,
- wherein in the first write operation,
- the controller is configured to further send third data of one page and a fifth write command,
- the controller is configured to further send fourth data of one page and a sixth write command,
- the semiconductor memory is configured to further store the third data in the third latch circuit and the fourth data in the fourth latch circuit, and further write the third data into the fourth plurality of memory cells in page units, and write the fourth data into the fifth plurality of memory cells in page units, and
- the semiconductor memory is configured to write data including the first data stored in the first latch circuit and the second data stored in the second latch circuit and the third data stored in the third latch circuit and the fourth data stored in the fourth latch circuit into the third plurality of memory cells, when receiving the third write command, and
- wherein in the second write operation,
- after sending the third write command, the controller is configured to further send a third read command and a fourth read command,
- the semiconductor memory is configured to further read the third data from the fourth plurality of memory cells to the third latch circuit in response to the third read command, and read the fourth data from the fifth plurality of memory cells to the fourth latch circuit in response to the fourth read command, and
- the semiconductor memory is configured to overwrite data including the first data, the second data, the third data, and the fourth data that are read to the first latch circuit, the second latch circuit, the third latch circuit, and the fourth latch circuit in the third plurality of memory cells in response to the fourth write command.

18. The system according to claim 17, wherein the semiconductor memory includes a first block, a second block, a third block, a fourth block, and a fifth block,
- the first plurality of memory cells are included in the first block,
- the second plurality of memory cells are included in the second block,
- the fourth plurality of memory cells are included in the third block,
- the fifth plurality of memory cells are included in the fourth block, and
- the third plurality of memory cells are included in the fifth block.

19. The system according to claim 17, wherein the semiconductor memory includes a first block and a second block,
- the first plurality of memory cells are included in the first block,
- the second plurality of memory cells are included in the first block,
- the fourth plurality of memory cells are included in the first block,
- the fifth plurality of memory cells are included in the first block, and
- the third plurality of memory cells are included in the second block.

* * * * *